(12) United States Patent
Matsuura

(10) Patent No.: US 12,146,785 B2
(45) Date of Patent: Nov. 19, 2024

(54) SIGNAL GENERATION DEVICE, SIGNAL GENERATION METHOD, AND SIGNAL GENERATION PROGRAM

(71) Applicant: Murata Manufacturing Co., Ltd., Nagaokakyo (JP)

(72) Inventor: Masaru Matsuura, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 70 days.

(21) Appl. No.: 18/296,602

(22) Filed: Apr. 6, 2023

(65) Prior Publication Data
US 2023/0304853 A1    Sep. 28, 2023

Related U.S. Application Data

(63) Continuation of application No. PCT/JP2021/028602, filed on Aug. 2, 2021.

(30) Foreign Application Priority Data

Oct. 7, 2020 (JP) .................................. 2020-169575

(51) Int. Cl.
*G01H 17/00* (2006.01)
*G06F 3/01* (2006.01)
*H03C 1/46* (2006.01)

(52) U.S. Cl.
CPC ............. *G01H 17/00* (2013.01); *G06F 3/016* (2013.01); *H03C 1/46* (2013.01)

(58) Field of Classification Search
CPC .......... G01H 17/00; G06F 3/016; H03C 1/46; A63F 13/42; A63F 13/44; A63F 13/285
(Continued)

(56) References Cited

U.S. PATENT DOCUMENTS

| 9,652,945 B2 * | 5/2017 | Levesque ........... H04N 21/4325 |
| 2016/0012687 A1 | 1/2016 | Obana et al. |

(Continued)

FOREIGN PATENT DOCUMENTS

| JP | 2016016372 A |   | 2/2016 |
| JP | 201917475    | * | 2/2019 |

(Continued)

OTHER PUBLICATIONS

International Search Report in PCT/JP2021/028602, mailed Oct. 5, 2021, 3 pages.

*Primary Examiner* — Omar Casillashernandez
(74) *Attorney, Agent, or Firm* — ArentFox Schiff LLP

(57) ABSTRACT

A signal generation device that generates a waveform signal to cause a target object to generate a vibration according to a phenomenon. The device includes an envelope information acquisition unit that acquires first envelope information indicative of a first envelope of a first waveform signal corresponding to a first phenomenon, and second envelope information indicative of a second envelope of a second waveform signal corresponding to a second phenomenon. The device also includes a synthesis unit that generates a composite envelope obtained by synthesizing the envelopes based on the first envelope information and the second envelope information; and a modulation unit that modulates a force wave by the composite envelope to generate the waveform signal.

20 Claims, 26 Drawing Sheets

(58) Field of Classification Search
USPC .................................................... 340/407.1
See application file for complete search history.

(56) References Cited

U.S. PATENT DOCUMENTS

| | | | |
|---|---|---|---|
| 2016/0246378 A1* | 8/2016 | Sampanes | G06F 3/0482 |
| 2017/0365139 A1* | 12/2017 | Levesque | G06F 3/016 |
| 2019/0015744 A1 | 1/2019 | Ueda et al. | |
| 2020/0122028 A1 | 4/2020 | Konishi et al. | |
| 2020/0356173 A1* | 11/2020 | Bajaj | G08B 6/00 |

FOREIGN PATENT DOCUMENTS

| | | |
|---|---|---|
| JP | 2019017475 A | 2/2019 |
| JP | 2019063547 A | 4/2019 |
| WO | 2019038887 A1 | 2/2019 |

* cited by examiner

Fig. 7

| Event Content | Event ID | Envelope Generation Information | | |
|---|---|---|---|---|
| | | Envelope Waveform Information | Start Time Offset Information | Weighting Information |
| Character is pulled forward | ID=001 | Env1 | Ts1 | w1 |
| Character is pulled backward | ID=002 | Env2 | Ts2 | w2 |
| Character shoots a gun | ID=003 | Env3 | Ts3 | w3 |
| Character is hit from the front | ID=004 | Env4 | Ts4 | w4 |
| Character is hit from behind | ID=005 | Env5 | Ts5 | w5 |
| Character dances to BGM | ID=006 | Env6 | Ts6 | w6 |
| ....... | ....... | ....... | ....... | ....... |

101

E1, E2

Fig. 19
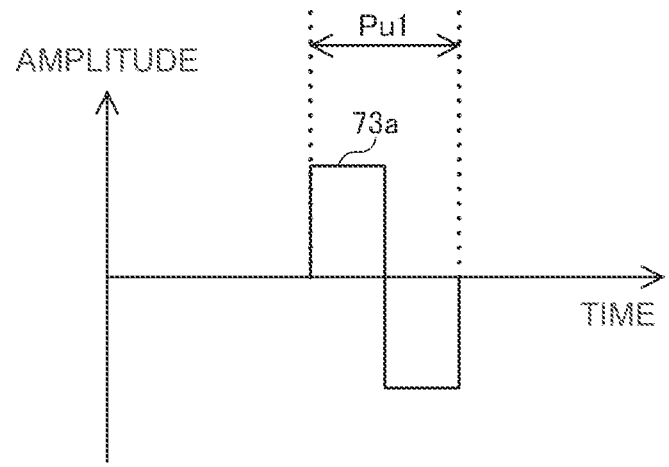
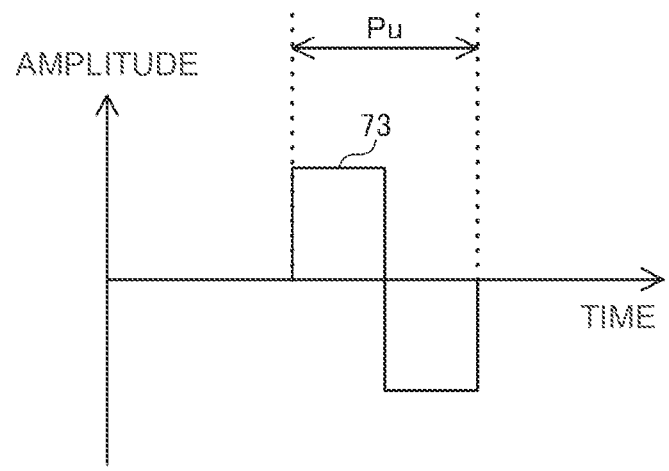
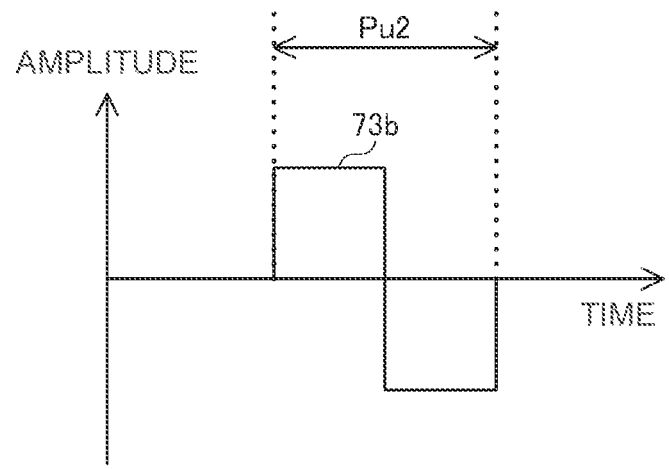

Fig. 20
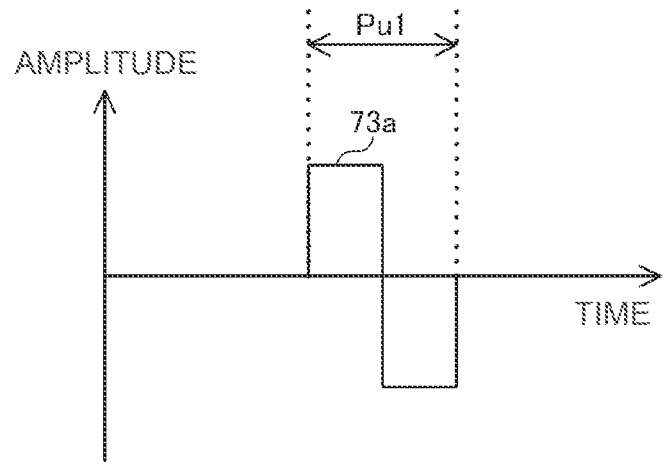
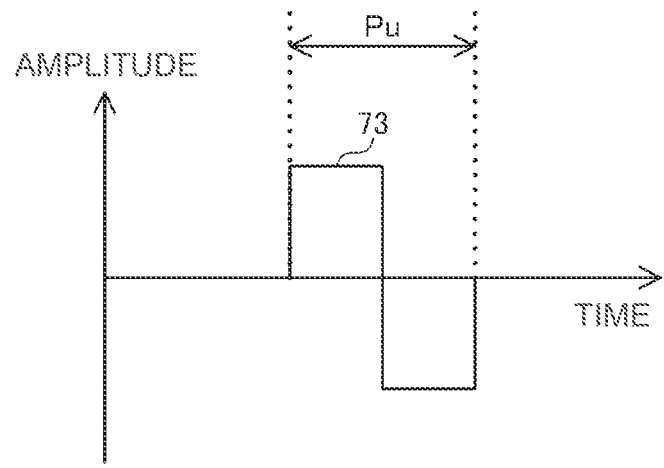
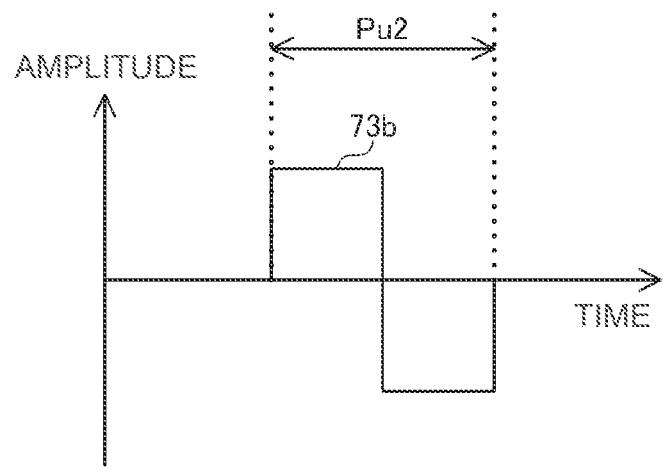

Fig. 21
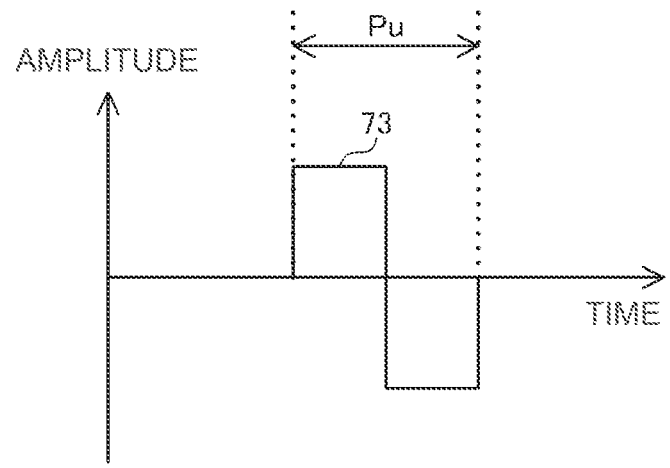
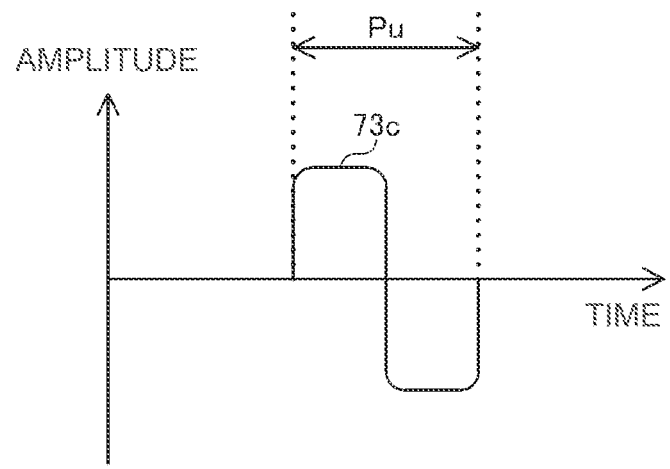
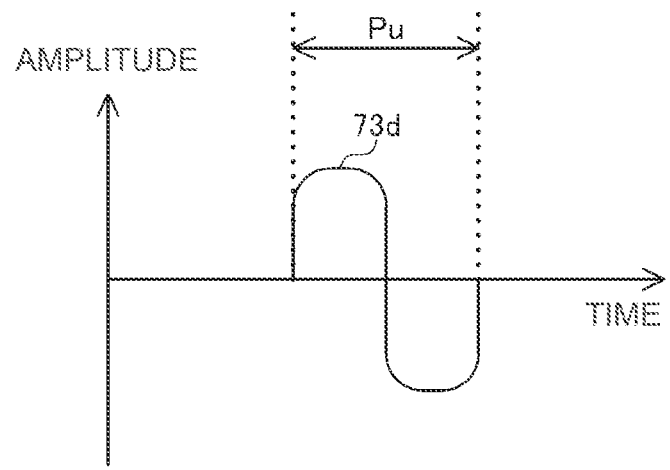

SIGNAL GENERATION DEVICE, SIGNAL GENERATION METHOD, AND SIGNAL GENERATION PROGRAM

CROSS REFERENCE TO RELATED APPLICATIONS

This application is a continuation of PCT Application No. PCT/JP2021/028602, filed Aug. 2, 2021, which claims priority to Japanese Patent Application No. 2020-169575, filed Oct. 7, 2020, the entire contents of each of which are hereby incorporated by reference in their entirety.

TECHNICAL FIELD

The present invention relates to a signal generation device, a signal generation method, and a signal generation program.

BACKGROUND

Currently, vibration devices are used while being held by a user in hand or worn on the body of the user. In such a vibration device, a vibration mechanism such as a linear resonant actuator or the like is incorporated to present a vibration to the user by operating this vibration mechanism, for example, as described in WO Publication No. 2019/038887 (hereinafter "Patent Document 1").

The vibration device described in Patent Document 1 generates a vibration according to the content of data obtained by synthesizing tactile sensory vibration data that represents the content of a tactile sensory vibration to cause a user to feel a tactile sensation as if the user had touched any object, and pseudo force sensory vibration data. Here, the pseudo force sensory vibration data is data representing a pseudo force sensory vibration to cause the user to feel a tractive force in a specific direction, which is specifically data representing the content of a vibration of repeating, at predetermined intervals, a basic waveform of a specific pattern composed of a sine wave, a triangle wave, a sawtooth wave, or a square wave, for example. Since the pseudo force sensory vibration is a periodic vibration, the vibration device may periodically vibrate for a certain period of time.

For example, the vibration device may be intended to vibrate for a certain period of time each time a phenomenon (e.g., an event) occurs such as that a character shoots a gun or that the character is hit in a virtual reality like in a game. Since the start time (e.g., the timing) of such a phenomenon is generally irregular, for example, when two phenomena have occurred, two vibrations interfere to strengthen each other or interfere to weaken each other depending on the start times of these phenomena. In other words, the modes of vibration when the two phenomena have occurred are unstable, and this is unfavorable because of giving a user an uncomfortable feeling.

SUMMARY OF THE INVENTION

Accordingly, it is an object of the present invention to provide a signal generation device, a signal generation method, and a signal generation program that stabilize vibration modes in a target object when two phenomena occurred in a configuration to generate a waveform signal for causing the target object to generate vibrations according to the respective phenomena.

In an exemplary aspect, a signal generation device is provided that generates a waveform signal for causing a target object to generate a vibration according to a phenomenon. In this aspect, the device includes an envelope information acquisition unit that acquires first envelope information indicative of a first envelope of a first waveform signal corresponding to a first phenomenon, and second envelope information indicative of a second envelope of a second waveform signal corresponding to a second phenomenon. Moreover, a synthesis unit generates a composite envelope obtained by synthesizing the envelopes based on the first envelope information and the second envelope information, and a modulation unit modulates a force wave by the composite envelope to generate the waveform signal.

According to the exemplary aspects of the present invention, a signal generation device, a signal generation method, and a signal generation program are provided that stabilize vibration modes in a target object when two phenomena occurred in a configuration to generate a waveform signal for causing the target object to generate vibrations according to the respective phenomena.

BRIEF DESCRIPTION OF DRAWINGS

FIG. 7 is a table illustrating correspondence information held on a disk in the signal generation device according to the first exemplary embodiment.

FIG. 19 is a graph illustrating an example of candidate unit force waves stored on the disk according to a second exemplary embodiment.

FIG. 20 is a graph illustrating an example of candidate unit force waves stored on the disk according to the second exemplary embodiment.

FIG. 21 is a graph illustrating an example of candidate unit force waves stored on the disk according to the second exemplary embodiment.

DETAILED DESCRIPTION OF EMBODIMENTS

Figure 1:
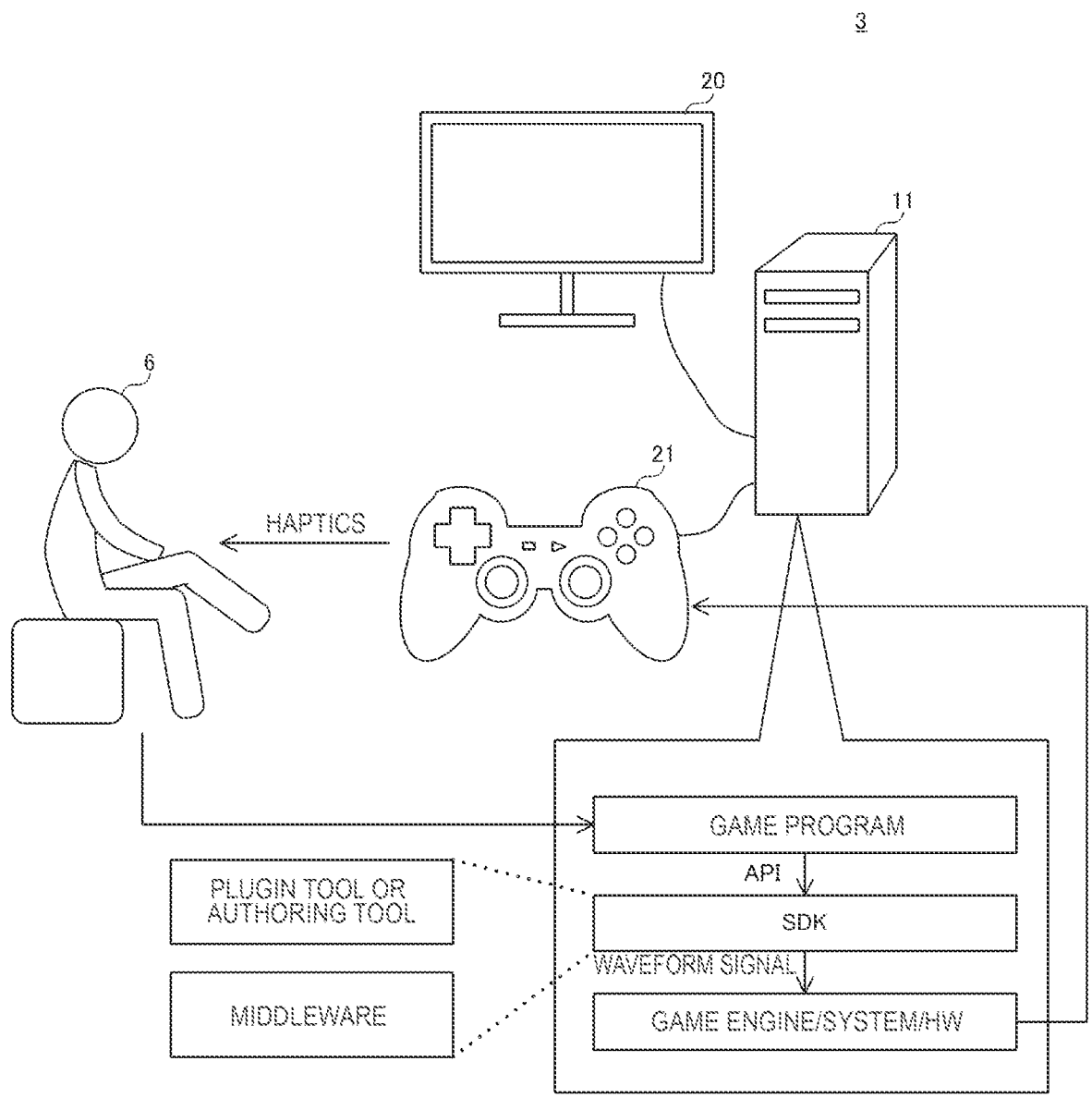
FIG. 1 is a diagram illustrating an overview of a game system according to a first exemplary embodiment.

Exemplary embodiments of the present invention will be described in detail below with reference to the accompanying drawings. It is noted that the same elements are given the same reference numerals to omit redundant description as much as possible.

First Exemplary Embodiment

A game system according to a first exemplary embodiment will be described. FIG. 1 is a diagram illustrating an overview of the game system according to the first embodiment. As illustrated in FIG. 1, a game system 3 mainly includes a computer 11, a display monitor 20, and a controller 21, which can be considered a target object for purposes of this disclosure.

For example, the computer 11 executes a game program and displays, on the display monitor 20, a virtual reality deployed by the game program. A user 6 is, for example, a game program creator or a game player. For example, the user 6 recognizes the situation of a character in the virtual reality projected on the display monitor 20, and operates the controller 21 to give movement to the character according to the situation of the game program. The computer 11 executes the game program according to the details of the operation performed on the controller 21.

Further, the computer 11 presents, to the user 6, at least one of "force sense," "pressure sense," and "tactile sense" by haptics (hereinafter, also called "haptic presentation" for purposes of this disclosure). Here, for example, the "force sense" includes a feel when being pulled or pushed, and a sense of response when being tightly held down or popped up. The "pressure sense" is, for example, a sense of touch when touching an object or when feeling the hardness or softness of the object. The "tactile sense" is, for example, the feeling of touch on the surface of the object, or a tactile sense and a feeling of roughness such as an uneven degree of the surface of the object.

The hierarchy of software and hardware in the computer 11 is composed of a game program in an application layer, an SDK (Software Development Kit) in a middle layer, and system/game engine/HW (Hardware) in a physical layer.

The SDK includes, for example, plugins or an authoring tool and middleware. In the middleware, a program for vibrating the controller 21 to give the user 6 at least one of the "force sense," the "pressure sense," and the "tactile sense" (hereinafter, which may also be called a target program) is included. For example, when a specific event has occurred to a character, the game program calls the target program according to an API (Application Programming Interface). At this time, for example, the game program passes, to the target program, event information indicative of the content of the event and the start time of the event (start timings of a first phenomenon and a second phenomenon). The content of the event is identified, for example, by an ID.

The specific event is, for example, that an external force to pull or push the character is applied to the character in the virtual reality, that the character shot a gun, that the character was hit, that the character is dancing to the music, or the like.

Based on the event information, the target program generates a waveform signal for haptic presentation of a sense according to the content of the event indicated by the event information. The target program transmits the generated waveform signal to the controller 21 through the game engine, an operating system, and hardware.

The controller 21 vibrates based on the waveform signal. The user 6 can hold the vibrating controller 21 by hand to recognize the situation of the character in the virtual reality by at least one of the "force sense," the "pressure sense," and the "tactile sense" in addition to sight and hearing.

Figure 2:
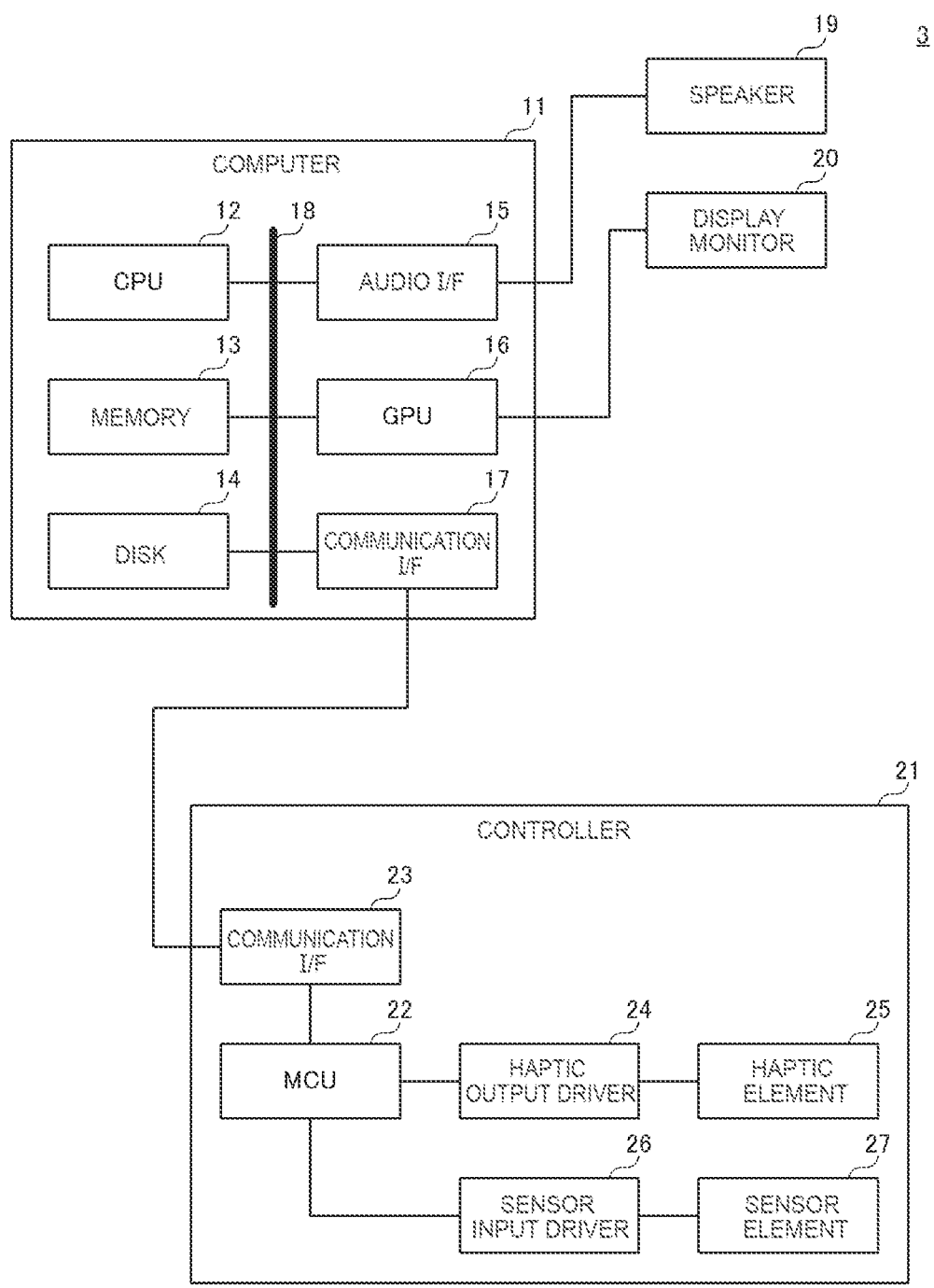
FIG. 2 is a diagram illustrating the hardware configuration of the game system according to the first exemplary embodiment.

FIG. 2 is a diagram illustrating the hardware configuration of the game system according to the first exemplary embodiment. As illustrated in FIG. 2, the game system 3 includes the computer 11, a speaker 19, the display monitor 20, and the controller 21. The computer 11 includes a CPU (Central Processing Unit) 12, a memory 13, a disk 14, an audio interface (I/F) 15, a GPU (Graphics Processing Unit) 16, a communication interface (I/F) 17, and a bus 18. The controller 21 includes an MCU (Micro Controller Unit) 22, a communication interface (I/F) 23, a haptic output driver 24, a haptic element 25, a sensor input driver 26, and a sensor element 27.

In the computer 11, the CPU 12, the memory 13, the disk 14, the audio interface 15, the GPU 16, and the communication interface 17 are connected to one another through the bus 18 to be able to transmit and receive data to and from one another.

According to an exemplary aspect, the disk 14 is a non-volatile storage device capable of reading and writing data such as an HDD (Hard Disk Drive) or an SSD (Solid State Drive), on which programs (code) such as the game program and the SDK are stored. Note that the disk 14 is not limited to the HDD or the SSD, and it may also be a memory card, a read-only CD-ROM (Compact Disc Read Only Memory), a DVD-ROM (Digital Versatile Disc-Read Only Memory), or the like. Further, the programs such as the target program can be installed externally. Further, the programs, such as the target program, circulate in such a state as to be stored on a storage medium readable by the computer 11 like the disk 14. Note that the programs such as the target program may also circulate on the Internet connected through the communication interface.

The memory 13 is a volatile storage device, such as a DRAM (Dynamic Random Access Memory). The communication interface 17 transmits and receives various data to and from the communication interface 23 in the controller 21. This communication may be performed by wire or wirelessly, and any communication protocol may be used as long as the communication with each other can be performed. The communication interface 17 transmits various data to the controller 21 according to instructions from the CPU 12. Further, the communication interface 17 receives various data transmitted from the controller 21, and outputs the received data to the CPU 12.

Upon execution of a program, the CPU 12 transfers, to the memory 13, the program stored on the disk 14 and data required to execute the program. The CPU 12 reads, from the memory 13, processing instructions and data required to execute the program, and executes arithmetic processing according to the content of the processing instructions. At this time, the CPU 12 may newly generate data required to execute the program and store the data in the memory 13. Note that the CPU 12 is not limited to acquiring the program and data from the disk 14, and the CPU 12 may also acquire the program and data from a server or the like via the Internet.

Specifically, for example, upon execution of the game program, the CPU 12 receives the details of operations of the user 6 to the controller 21 to execute processing instructions according to the operation details in order to give movement to the character in the virtual reality. At this time, the CPU 12 performs processing for haptic presentation, video display, and audio output according to the situation of the character in the virtual reality.

More specifically, for example, when the external force to pull or push the character is applied to the character in the virtual reality, the CPU 12 generates a waveform signal for haptic presentation of the force sense when the external force is applied.

Further, for example, when the character shoots a gun in the virtual reality, the CPU 12 generates a waveform signal for haptic presentation of a sense of reaction when the character shot the gun.

Further, for example, when the character was hit in the virtual reality, the CPU 12 generates a waveform signal for haptic presentation of a sense of shock when the character was hit.

Further, for example, when the character is dancing to the music in the virtual reality, the CPU 12 generates a waveform signal for haptic presentation of a feeling of dynamism toward musical beat and rhythm.

The CPU 12 digitally encodes the generated waveform signal to generate haptic information, and outputs the generated haptic information to the controller 21 via the communication interface 17.

Further, the CPU 12 generates screen information required for video display such as the character moving in the virtual reality and the background, and outputs the generated screen information to the GPU 16. For example, the GPU 16 receives the screen information from the CPU 12, performs rendering and the like based on the screen information, and generates a digital video signal including a video such as 3D graphics. The GPU 16 transmits the generated digital video signal to the display monitor 20 to display the 3D graphics and the like on the display monitor 20.

Further, the CPU 12 generates audio information indicative of audio according to the environment, movement, and situation of the character in the virtual reality, and outputs the generated audio information to the audio interface 15. For example, the audio interface 15 receives the audio information from the CPU 12, performs rendering and the like based on the received audio information, and generates an audio signal. The audio interface 15 transmits the generated audio signal to the speaker 19 to output sound from the speaker 19.

According to an exemplary aspect, the haptic element 25 in the controller 21 is a vibration actuator configured to convert an electronic signal to mechanical vibration, which is, for example, a voice coil actuator with a wide frequency band of vibration dampening. Note that the haptic element 25 may also be an eccentric motor, a linear resonant actuator, an electromagnetic actuator, a piezoelectric actuator, an ultrasonic actuator, an electrostatic actuator, a polymer actuator, or the like.

The MCU 22 controls the haptic output driver 24 and the sensor input driver 26. Specifically, for example, when power is supplied, the MCU 22 reads a program stored in a ROM (not illustrated) to execute arithmetic processing according to the content of the program.

In the present embodiment, for example, when receiving the haptic information from the computer 11 via the communication interface 23, the MCU 22 controls the haptic output driver 24 based on the received haptic information to perform haptic presentation by the haptic element 25.

Specifically, the MCU 22 outputs the haptic information to the haptic output driver 24. The haptic output driver 24 receives the haptic information from the MCU 22, generates an analog electronic signal as an electronic signal according to the waveform signal and capable of driving the haptic element 25 based on the received haptic information, and outputs the electronic signal to the haptic element 25. Thus, the haptic element 25 is configured to vibrate based on the electronic signal to perform a haptic presentation.

The sensor element 27 senses the movements of operation parts operated by the user 6, such as a joystick and a button, provided in the controller 21, and outputs an analog electronic signal indicative of the sensing result to the sensor input driver 26.

For example, the sensor input driver 26 operates under the control of the MCU 22 to supply, to the sensor element 27, power required to drive, and receives an electronic signal from the sensor element 27 to convert the received electronic signal to a digital signal. The sensor input driver 26 outputs the converted digital signal to the MCU 22. Based on the digital signal received from the sensor input driver 26, the MCU 22 generates operation information indicative of the details of operations of the user 6 to the controller 21, and transmits the operation information to the computer 11 via the communication interface 23.

Figure 3:
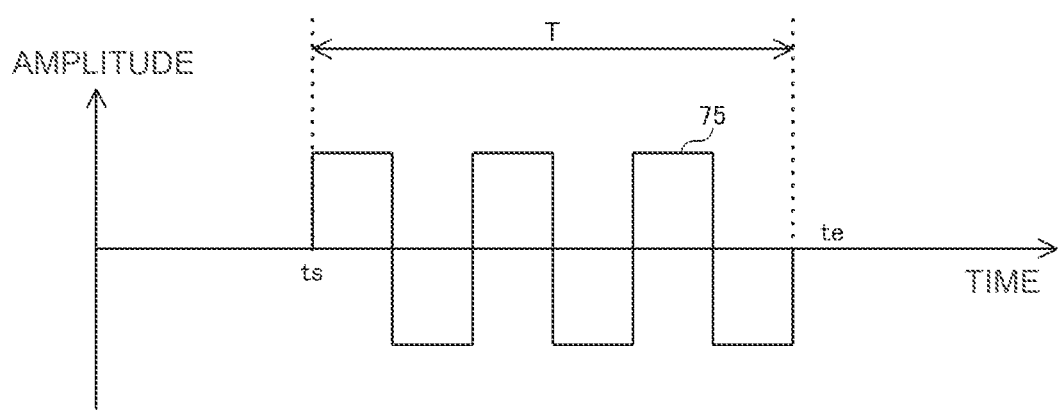
FIG. 3 is a graph illustrating an example of a waveform signal according to the first exemplary embodiment.

FIG. 3 is a graph illustrating an example of a waveform signal according to the first exemplary embodiment. Note that the horizontal axis indicates time and the vertical axis indicates amplitude in FIG. 3. As illustrated in FIG. 3, a waveform signal 75 is, for example, a periodic square wave that continues for a certain amount of time. In the present embodiment, the waveform signal 75 is a square wave that continues during a period T1 from time ts to time te. Note that the amplitude of the waveform signal 75 may also change overtime. Further, the length of the period T1 can be set arbitrarily.

[Problem 1]

For example, if a second haptic presentation is performed before the end of a first haptic presentation when a haptic presentation is performed for each event, the user 6 may not be able to receive an expected haptic presentation.

Figure 4:
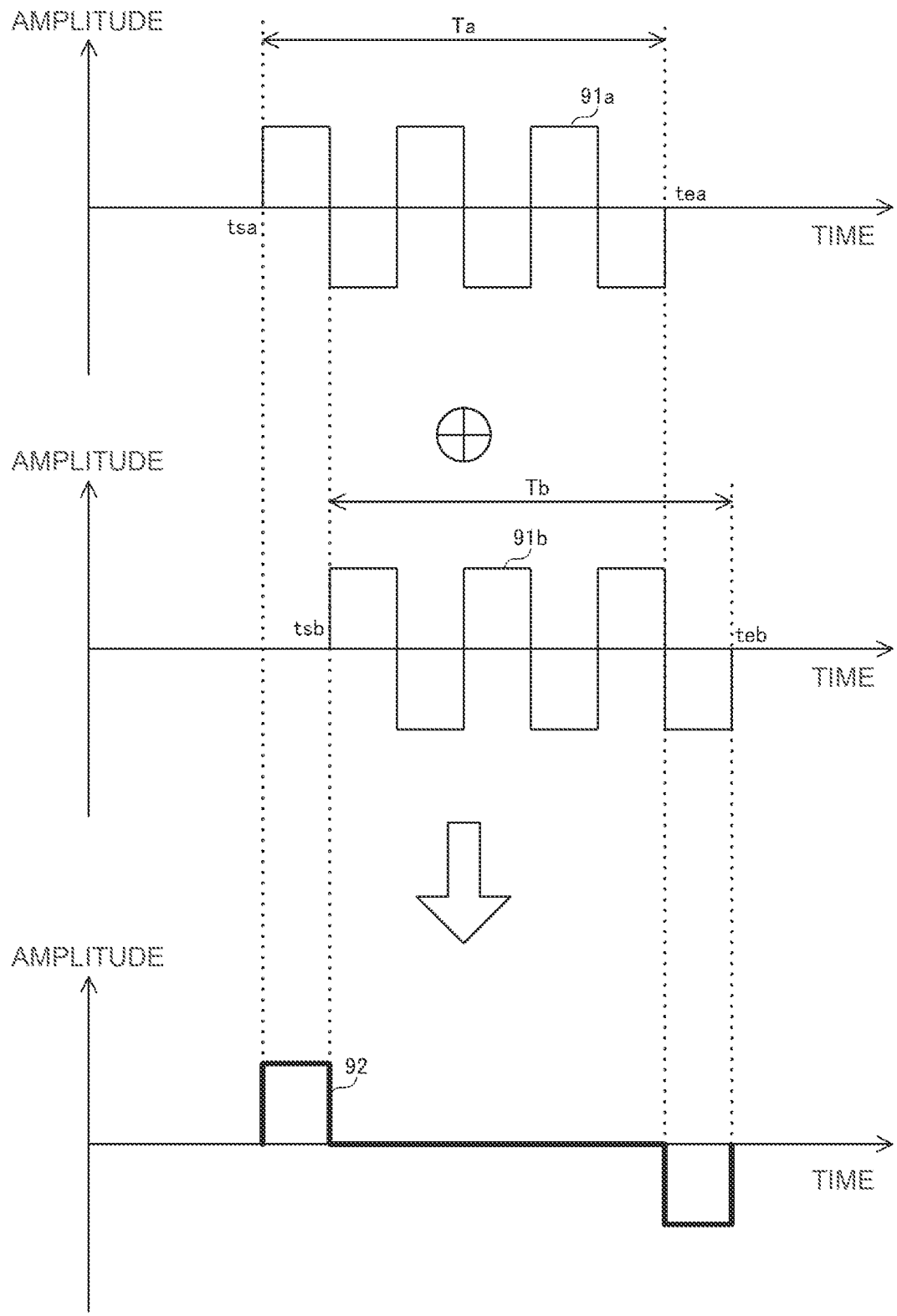
FIG. 4 is a graph for describing Problem 1.

FIG. 4 is a graph for describing Problem 1. As illustrated in FIG. 4, for example, such a situation that the character in the virtual reality is pulled forward at time tsa and further pulled forward at time tsb after time tsa is assumed. Since the character is further pulled forward after being pulled forward, it is considered that the user 6 expects a force sense of being pulled forward in two stages.

However, such a configuration that a reference waveform signal 91a when the character is pulled forward at time tsa and a reference waveform signal 91b when the character is pulled forward at time tsb are simply overlapped and synthesized causes a problem below.

In other words, when a difference between the start time tsa of the reference waveform signal 91a and the start time tsb of the reference waveform signal 91b corresponds to a half cycle of the square wave in the reference waveform signal 91a, the reference waveform signals 91a and 91 b interfere to weaken each other, and a vibration based on a reference composite waveform signal 92 with zero amplitude from time tsb to the end time tea of the reference waveform signal 91a is presented to the user 6. The user 6 expected a force sense of being pulled forward in two stages, but the user 6 feels only a weak force sense, and hence feels uncomfortable (i.e., an unexpected force sense).

On the other hand, though not illustrated, when the difference between time tsa and time tsb corresponds to one cycle of the square wave in the reference waveform signal 91a, the reference waveform signals 91a and 91b interfere to strengthen each other, and the user 6 can receive an expected force sense. In other words, since the force sense perceived by the user 6 is uncomfortable or expected depending on the difference between the start time of a first event and the start time of a second event, such a configuration that the reference waveform signal 91a and the reference waveform signal 91b are simply overlapped and synthesized is difficult to stabilize the force sense perceived by the user 6.

[Problem 2]

Figure 5:
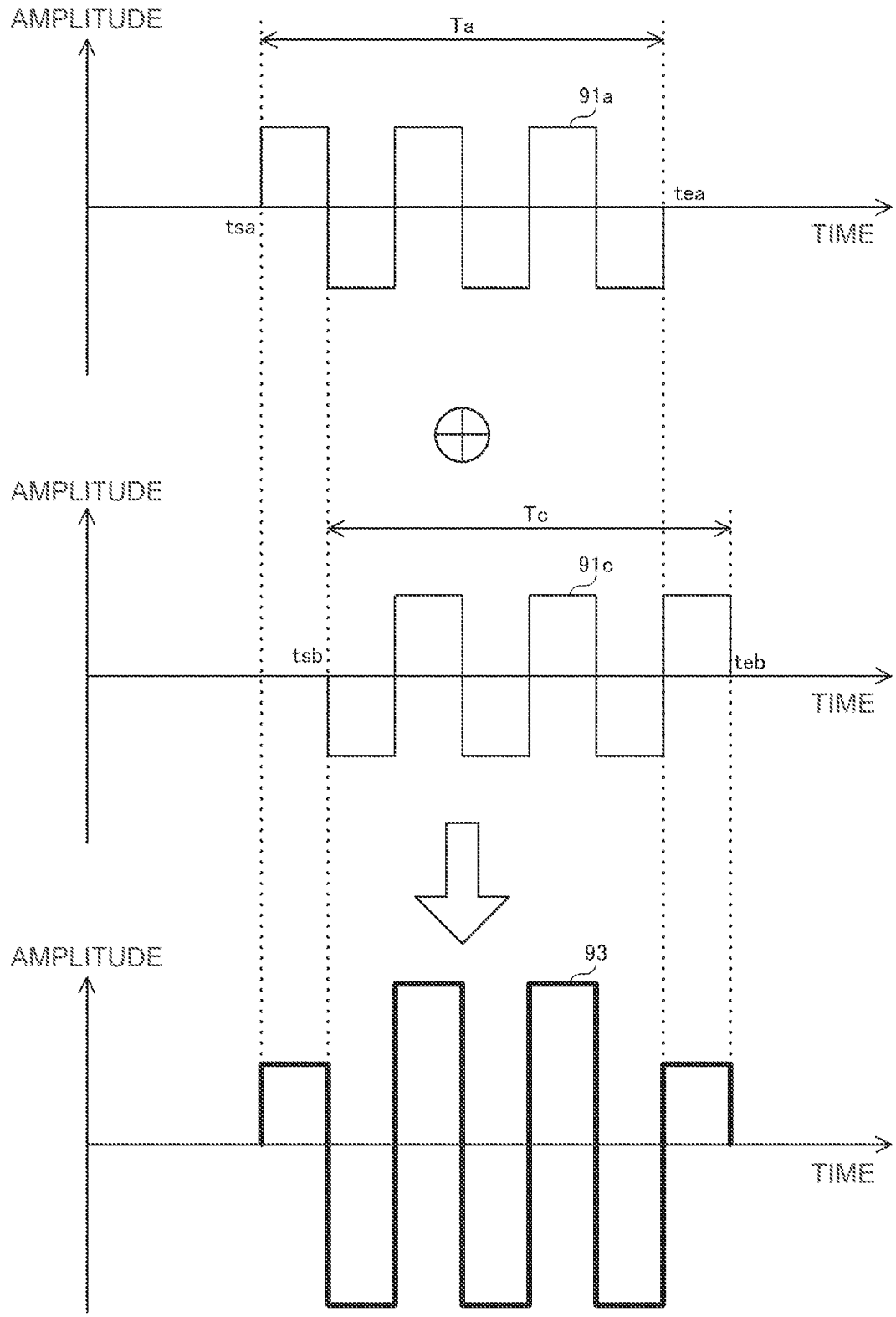
FIG. 5 is a graph for describing Problem 2.

FIG. 5 is a graph for describing Problem 2. As illustrated in FIG. 5, for example, such a situation that the character in the virtual reality is pulled forward at time tsa and then pulled backward as the opposite direction of the forward side at time tsb after time tsa is assumed. Since the character is pulled backward after being pulled forward, it is considered that the user 6 expects a weak force sense of being not pulled both to the forward side and the backward side.

However, such a configuration that the reference waveform signal 91a when the character is pulled forward at time tsa and a reference waveform signal 91c when the character is pulled backward at time tsb are simply overlapped and synthesized causes a problem below.

In other words, when a difference between time tsa and time tsb corresponds to a half cycle of the square wave in the reference waveform signal 91a, since the sign of the reference waveform signal 91c is opposite to that of the reference waveform signal 91a, the reference waveform signals 91a and 91c interfere to strengthen each other. Therefore, a vibration based on a reference composite waveform signal 93 with a large amplitude is presented to the user 6 from the start time tsb of the reference waveform signal 91c to the end time tea of the reference waveform signal 91a. Since the user 6 receives a strong force sense even though the user 6 expects a weak force sense of being not pulled both to the forward side and the backward side, the user 6 feels uncomfortable (i.e., another unexpected force sense).

On the other hand, though not illustrated, when the difference between time tsa and time tsb corresponds to one cycle of the square wave in the reference waveform signal 91a, the reference waveform signals 91a and 91c interfere to weaken each other, and the user 6 can receive an expected weak force sense. In other words, since the force sense perceived by the user 6 is uncomfortable or expected depending on the difference between the start time of the first event and the start time of the second event, such a configuration that the reference waveform signal 91a and the reference waveform signal 91c are simply overlapped and synthesized is difficult to stabilize the force sense perceived by the user 6.

[Configuration of Signal Generation Device]

Figure 6:
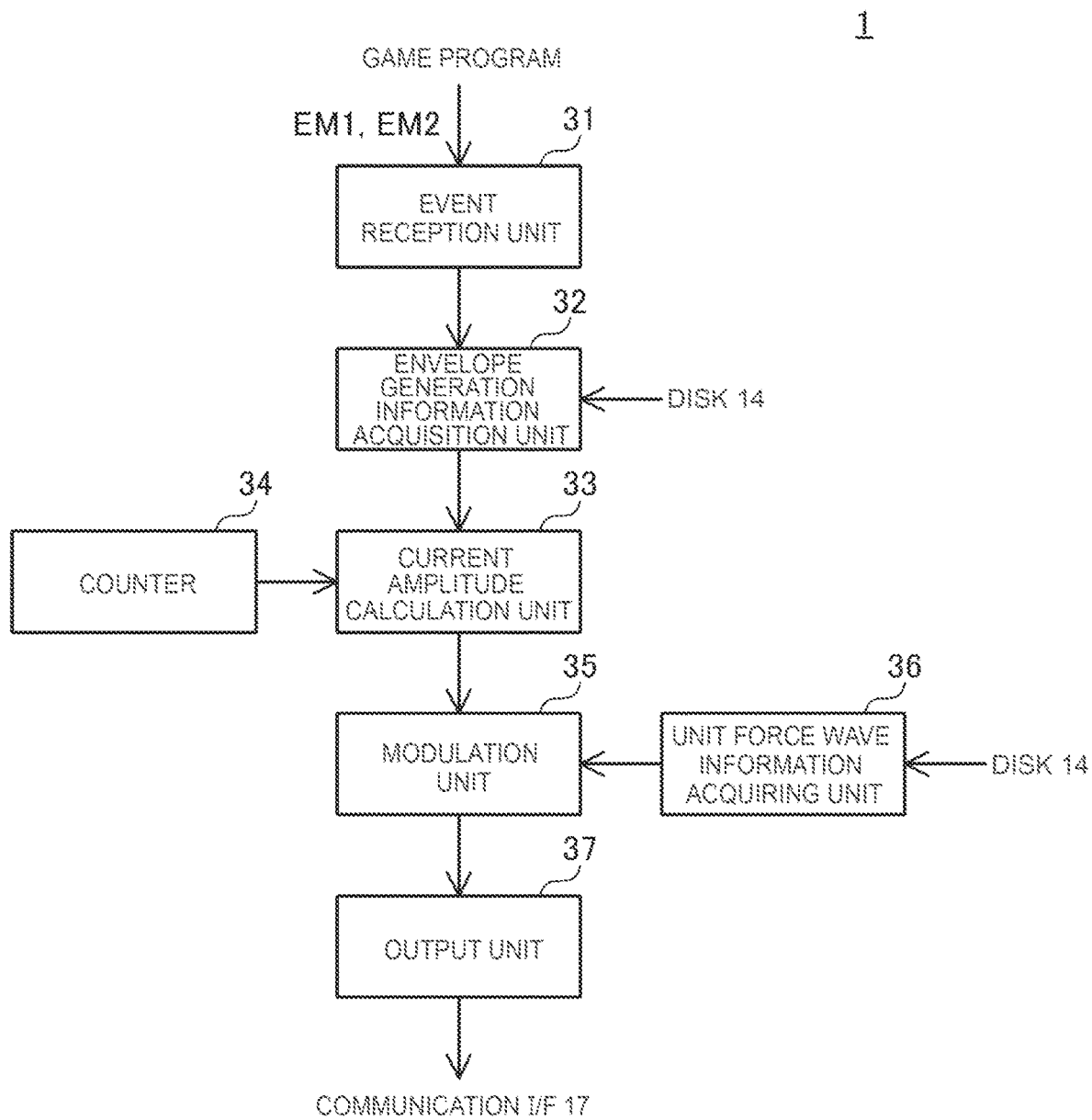
FIG. 6 is a block diagram illustrating the configuration of a signal generation device according to the first exemplary embodiment.

FIG. 6 is a block diagram illustrating the configuration of a signal generation device according to the first exemplary embodiment. For example, a signal generation device 1 is implemented by causing the CPU 12 in the computer 11 to execute a signal generation program as an example of the target program. The signal generation device 1 includes, as functional blocks, an event reception unit 31, an envelope generation information acquisition unit 32 (e.g., an envelope information acquisition unit and a weighting information acquisition unit), a current amplitude calculation unit 33 (e.g., a synthesis unit), a counter 34, a modulation unit 35, a unit force wave information acquiring unit 36, and an output unit 37.

The counter 34 counts clock pulses generated by an oscillator circuit using a crystal oscillator or the like, and holds the counted value. For example, this counted value indicates current time.

For example, the event reception unit 31 accepts event information from the game program when a specific event has occurred to the character in the virtual reality.

In the present embodiment, when such an event that the character is pulled forward in the virtual reality (hereinafter, which may also be called event E1) has occurred, the event reception unit 31 receives, from the game program, event information indicative of an ID of the event E1 and the start time of the event E1 (hereinafter, which may also be called event information EM1).

Further, when such an event that the character is pulled backward in the virtual reality (hereinafter, which may also be called event E2) has occurred, the event reception unit 31 receives, from the game program, event information indicative of an ID of the event E2 and the start time of the event E2 (hereinafter, which may also be called event information EM2).

Each time the event reception unit 31 receives the event information EM1 or the event information EM2 from the game program, the event reception unit 31 outputs the event information EM1 or the event information EM2 to the envelope generation information acquisition unit 32.

Figure 8:
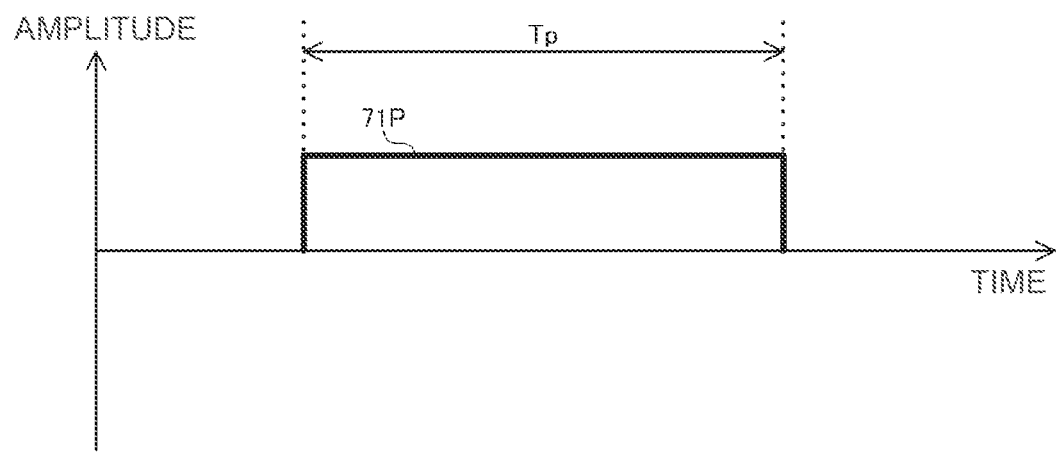
FIG. 8 is a graph illustrating an example of an event-specific force amplitude envelope indicated by envelope waveform information held by the signal generation device according to the first exemplary embodiment.
Figure 9:
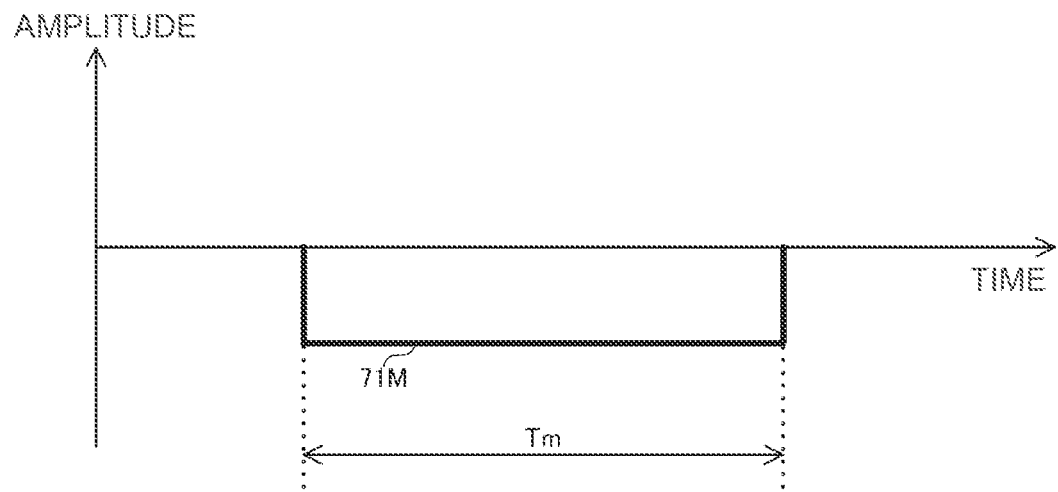
FIG. 9 is a graph illustrating an example of an event-specific force amplitude envelope indicated by the envelope waveform information held by the signal generation device according to the first exemplary embodiment.

FIG. 7 is a table illustrating correspondence information held on the disk in the signal generation device according to the first exemplary embodiment. FIG. 8 and FIG. 9 are graphs illustrating examples of event-specific force amplitude envelopes indicated by envelope waveform information held by the signal generation device according to the first exemplary embodiment. Note that the horizontal axis indicates time and the vertical axis indicates amplitude in FIG. 8 and FIG. 9.

As illustrated in FIG. 7 to FIG. 9, correspondence information 101 indicates correspondences among "Event Content," "Event ID," and "Envelope Generation Information." For purposes of this disclosure, the "Envelope Generation Information" is information for generating each envelope, which includes "Envelope Waveform Information," "Start Time Offset Information," and "Weighting Information."

For example, the "Event Content" is that the "character is pulled forward," the "character is pulled backward," the "character shoots a gun," the "character is hit from the front," the "character is hit from behind," the "character dances to the BGM," and the like.

The "Event ID" is a number unique to each event content. In the present embodiment, for example, "001" and "002" are assigned to the event content that the "character is pulled forward," and the event content that the "character is pulled backward," respectively.

According to an exemplary aspect, the "Envelope Waveform Information" is data for creating a waveform of an envelope (hereinafter, which may also be called an event-specific force amplitude envelope) of a waveform signal corresponding to each event content. For example, the event-specific force amplitude envelope has a waveform different from event content (event ID) to event content (event ID). Specifically, for example, the "Envelope Waveform Information" is data that in which pairs of times and amplitudes at respective times are arranged in chronological order. Note that, for example, when the waveform of the event-specific force amplitude envelope is generated by a spline curve, the "Envelope Waveform Information" may also be data indicative of pairs of times at control points used for the spline curve and amplitudes at the times.

In the present embodiment, envelope waveform information Env1 corresponds to an event with an "event ID" of "001," which represents an event-specific force amplitude envelope 71P illustrated in FIG. 8. In the present embodiment, the event-specific force amplitude envelope 71P is set to have a positive amplitude for the event E1 that the "character is pulled forward."

Envelope waveform information Env2 corresponds to an event with an "event ID" of "002," which represents an event-specific force amplitude envelope 71M illustrated in FIG. 9. In the present embodiment, the event-specific force amplitude envelope 71M is set to have an amplitude the sign of which is different from that of the event-specific force amplitude envelope 71P, that is, a negative amplitude, for the event E2 that the "character is pulled backward." In the present embodiment, the event-specific force amplitude envelope 71P and the event-specific force amplitude envelope 71M have a symmetrical shape with respect to the axis on which the amplitude is zero, that is, with respect to the time axis. Note that the event-specific force amplitude envelope 71P and the event-specific force amplitude envelope 71M may also have asymmetrical shapes with respect to the time axis.

For example, the "Start Time Offset Information" indicates a difference between the start time of the event-specific force amplitude envelope and the start time of an event indicated by the event information. For example, when it is intended to start a vibration in the controller 21 at the time when an event occurs to the character in the virtual reality, a value indicated by the start time offset information is set to zero.

Further, when it is intended to make the start time of the vibration in the controller 21 earlier or later than the time at which the event occurs to the character in the virtual reality in consideration of perceptual properties of a force sense, the value indicated by the start time offset information is set to a non-zero value. In the present embodiment, for example, when the value indicated by the start time offset information is set to a positive value, the start time of the vibration in the controller 21 is made later than the time when the event occurs to the character in the virtual reality. On the other hand, when the value indicated by the start time offset information is set to a negative value, the start time of the vibration in the controller 21 is made earlier than the time when the event occurs to the character in the virtual reality.

For example, the "Weighting Information" indicates a weight given to the amplitude of the event-specific force amplitude envelope. Specifically, for example, when pieces of weighting information w1 and w2 corresponding to "Event IDs" of "001" and "002" indicate 1, respectively, the event-specific force amplitude envelope 71P (see FIG. 8) and the event-specific force amplitude envelope 71M (see FIG. 9) are used as they are.

On the other hand, for example, when a value indicated by weighting information w3 corresponding to an event ID of "003" is 3, the amplitude is tripled and an event-specific force amplitude envelope represented by envelope waveform information Env3 is used. Further, for example, when a value indicated by weighting information w4 corresponding to an event ID of "004" is 0.5, the amplitude is multiplied by 0.5, and an event-specific force amplitude envelope represented by envelope waveform information Env4 is used.

As illustrated in FIG. 6, when receiving the event information EM1 from the event reception unit 31, the envelope generation information acquisition unit 32 refers to the correspondence information 101 (see FIG. 7) stored on the disk 14. Then, based on the event information EM1, the envelope generation information acquisition unit 32 acquires, from the disk 14, envelope generation information corresponding to the "Event ID" of "001," that is, the envelope waveform information Env1, start time offset information Ts1, and the weighting information w1.

Based on the start time of the event E1 indicated by the event information EM1 and a value indicated by the start time offset information Ts1, the envelope generation information acquisition unit 32 calculates time to start the event-specific force amplitude envelope 71P (hereinafter, which may also be called a first set time).

The envelope generation information acquisition unit 32 generates first envelope setting information including the first set time, the envelope waveform information Env1, and the weighting information w1, and outputs the generated first envelope setting information to the current amplitude calculation unit 33.

Further, when receiving the event information EM2 from the event reception unit 31, the envelope generation information acquisition unit 32 refers to the correspondence information 101 stored on the disk 14. Then, based on the event information EM2, the envelope generation information acquisition unit 32 acquires, from the disk 14, envelope generation information corresponding to the "Event ID" of "002," that is, the envelope waveform information Env2, start time offset information Ts2, and the weighting information w2.

Based on the start time of the event E2 indicated by the event information EM2 and a value indicated by the start time offset information Ts2, the envelope generation information acquisition unit 32 calculates time to start the event-specific force amplitude envelope 71M (hereinafter, which may also be called a second set time).

The envelope generation information acquisition unit 32 generates second envelope setting information including set time information indicative of the second set time, the envelope waveform information Env2, and the weighting information w2, and outputs the generated second envelope setting information to the current amplitude calculation unit 33.

When receiving the first envelope setting information from the envelope generation information acquisition unit 32, the current amplitude calculation unit 33 calculates the start time and end time of the event-specific force amplitude envelope 71P (see FIG. 8) based on the first set time and the envelope waveform information Env1 included in the received first envelope setting information. Then, the current amplitude calculation unit 33 sets a generation period from the start time to the end time (hereinafter, which may also be called a waveform signal generation period Tp).

Further, based on the weighting information w1 included in the first envelope setting information, the current amplitude calculation unit 33 can be configured to perform processing for weighting the amplitude of the event-specific force amplitude envelope 71P. In the present embodiment, since a value indicated by the weighting information w1 is 1, the amplitude of the event-specific force amplitude envelope 71P is the same before and after the processing.

When receiving the second envelope setting information from the envelope generation information acquisition unit 32, the current amplitude calculation unit 33 calculates the start time and end time of the event-specific force amplitude envelope 71M (see FIG. 9) based on the second set time and the envelope waveform information Env2 included in the received second envelope setting information. Then, the current amplitude calculation unit 33 sets a generation period from the start time to the end time (hereinafter, which may also be called a waveform signal generation period Tm).

Further, based on the weighting information w2 included in the second envelope setting information, the current amplitude calculation unit 33 is configured to perform processing for weighting the amplitude of the event-specific force amplitude envelope 71M. In the present embodiment, since a value indicated by the weighting information w2 is 1, the amplitude of the event-specific force amplitude envelope 71M is the same before and after the processing.

The current amplitude calculation unit 33 sets a confirmation time, for example, in every predetermined time interval. The current amplitude calculation unit 33 monitors the counted value of the counter 34, that is, the current time, and when the confirmation time comes, the current amplitude calculation unit 33 confirms whether or not waveform signal generation periods overlap.

Here, the fact that the waveform signal generation periods overlap means that the next waveform signal generation period Tp or Tm is started before the end of the waveform signal generation period Tp or Tm. On the other hand, the fact that the waveform signal generation periods do not overlap means that the next waveform signal generation period Tp or Tm is started after the end of the waveform signal generation period Tp or Tm.

When confirming that the waveform signal generation periods do not overlap, the current amplitude calculation unit 33 acquires a value of the amplitude of the event-specific force amplitude envelope 71P or 71M at the current time, which may also be called an "envelope current amplitude", and outputs the acquired value of the envelope current amplitude to the modulation unit 35.

Figure 10:
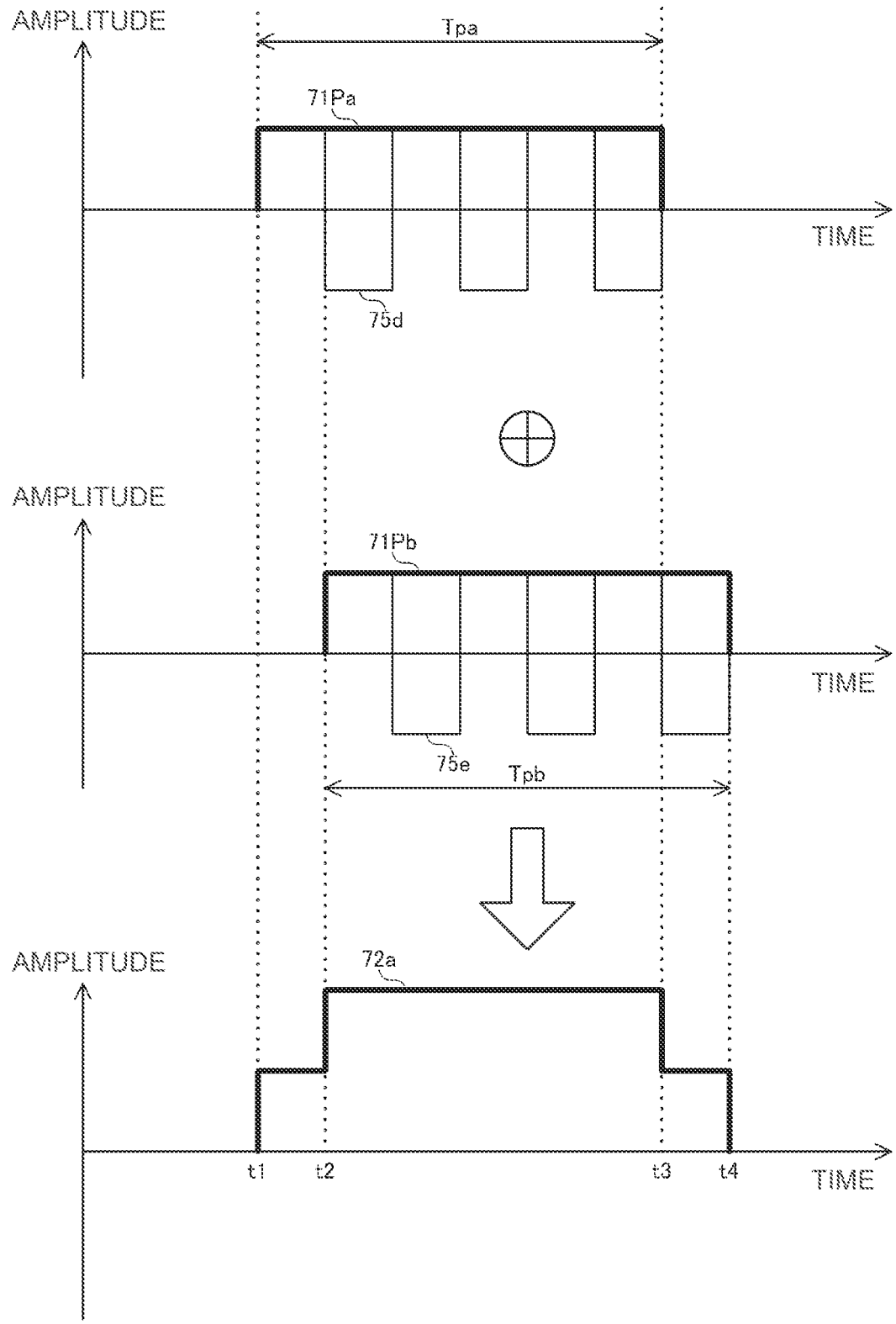
FIG. 10 is a graph illustrating an example of event-specific force amplitude envelopes synthetically processed by the signal generation device according to the first exemplary embodiment.

FIG. 10 is a graph illustrating an example of event-specific force amplitude envelopes synthetically processed by the signal generation device according to the first exemplary embodiment. Note that each horizontal axis indicates time and each vertical axis indicates amplitude in FIG. 10.

As shown in FIG. 10, an event-specific force amplitude envelope 71Pa (first envelope) and an event-specific force amplitude envelope 71Pb (second envelope) are illustrated. Here, the event-specific force amplitude envelope 71Pa is an envelope of a waveform signal 75d (first waveform signal) corresponding to the event E1 (first phenomenon). The event-specific force amplitude envelope 71Pb is an envelope of a waveform signal 75e (second waveform signal) corresponding to another event E1 (second phenomenon) that occurred after the event E1 concerned. In FIG. 10, the sign of the event-specific force amplitude envelope 71Pa and the sign of the event-specific force amplitude envelope 71Pb are the same.

The first set time and the envelope waveform information Env1 included in the first envelope setting information used to generate the event-specific force amplitude envelope 71Pa are first envelope information P1 indicative of the event-specific force amplitude envelope 71Pa. The first set time and the envelope waveform information Env1 included in the first envelope setting information used to generate the event-specific force amplitude envelope 71Pb are second envelope information P2 indicative of the event-specific force amplitude envelope 71Pb. In this case, the envelope information P1 and the second envelope information P2 are different in terms of the first set time.

Start time t2 (second timing) of a waveform signal generation period Tpb of the event-specific force amplitude envelope 71Pb is between start time t1 (first timing) of a waveform signal generation period Tpa of the event-specific force amplitude envelope 71Pa and end time t3 of the waveform signal generation period Tpa. Note that the start time t2 is time after a half cycle of the waveform signal 75d from the start time t1 in FIG. 10.

As illustrated in FIG. 6 and FIG. 10, when confirming that the waveform signal generation periods overlap, the current amplitude calculation unit 33 generates a composite envelope 72a by synthesizing (overlapping) the event-specific force amplitude envelope 71Pa and the event-specific force amplitude envelope 71Pb.

Here, the composite envelope 72a has the same amplitude as that of the event-specific force amplitude envelope 71Pa from the start time t1 to the start time t2. Further, the composite envelope 72a has an amplitude obtained by adding up the amplitude of the event-specific force amplitude envelope 71Pa and the amplitude of the event-specific force amplitude envelope 71Pb, that is, twice the amplitude of the event-specific force amplitude envelope 71Pa, from the start time t2 to the end time t3. Further, the composite envelope 72a has the same amplitude as the amplitude of the event-specific force amplitude envelope 71Pb from the end time t3 to the end time t4 of the waveform signal generation period Tpb.

The current amplitude calculation unit 33 acquires a value of the envelope current amplitude of the composite envelope 72a, and outputs the acquired value of the envelope current amplitude to the modulation unit 35.

Figure 11:
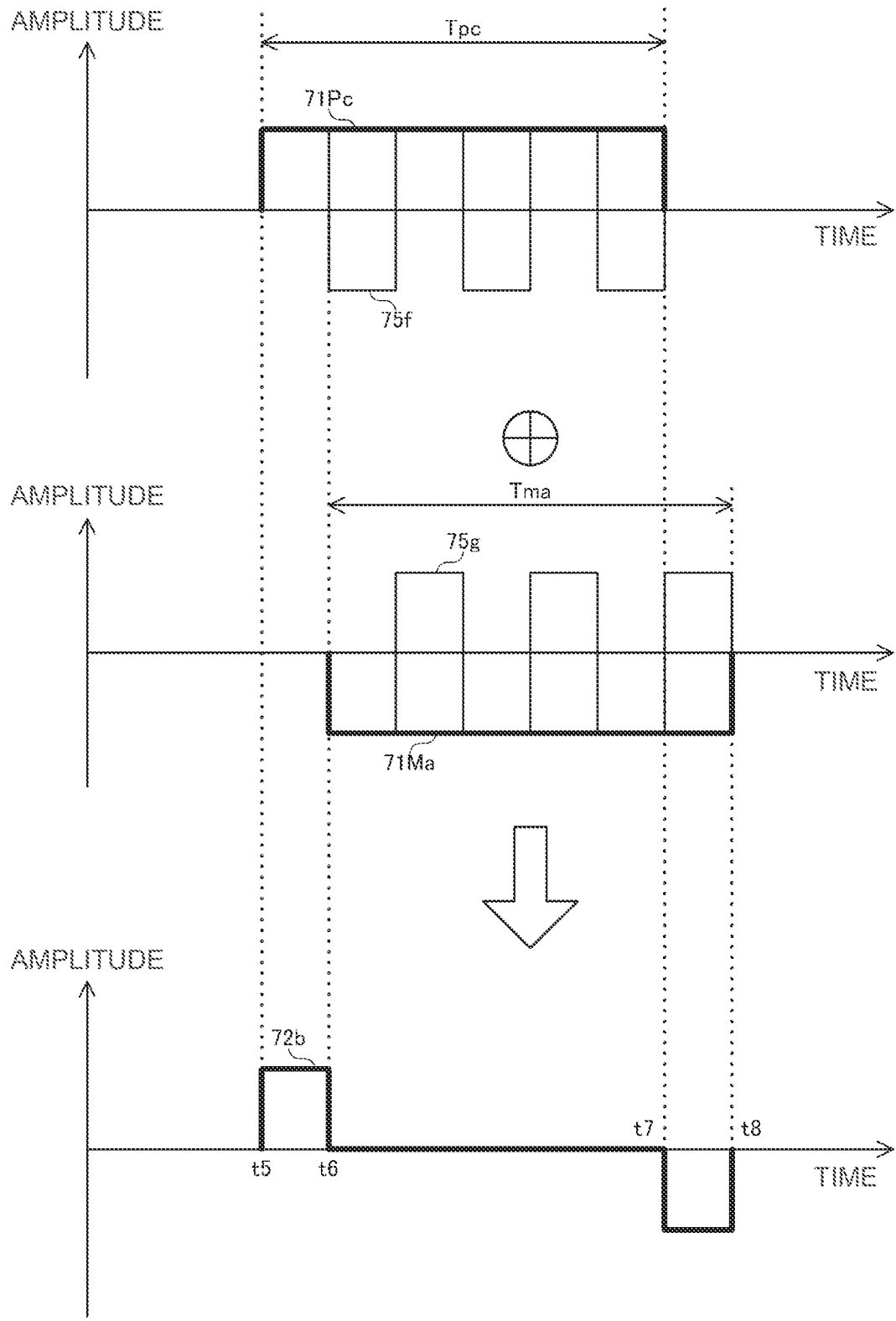
FIG. 11 is a graph illustrating an example of event-specific force amplitude envelopes synthetically processed by the signal generation device according to the first exemplary embodiment.

FIG. 11 is a graph illustrating an example of event-specific force amplitude envelopes synthetically processed by the signal generation device according to the first exemplary embodiment. Note that each horizontal axis indicates time and each vertical axis indicates amplitude in FIG. 11.

As shown in FIG. 11, an event-specific force amplitude envelope 71Pc (first envelope) and an event-specific force amplitude envelope 71Ma (second envelope) are illustrated. Here, the event-specific force amplitude envelope 71Pc is an envelope of a waveform signal 75f (first waveform signal) corresponding to the event E1 (first phenomenon). The event-specific force amplitude envelope 71Ma is an envelope of a waveform signal 75g (second waveform signal) corresponding to the event E2 (second phenomenon) that occurred after the event E1. In FIG. 11, the g of the event-specific force amplitude envelope 71Pc and the swg of the event-specific force amplitude envelope 71Ma are different.

The first set time and the envelope waveform information Env1 included in the first envelope setting information used to generate the event-specific force amplitude envelope 71Pc are first envelope information Q1 indicative of the event-specific force amplitude envelope 71Pc. The second set time and the envelope waveform information Env2 included in the second envelope setting information used to generate the event-specific force amplitude envelope 71Ma are second envelope information Q2 indicative of the event-specific force amplitude envelope 71Ma. In this case, both the first set time and the envelope waveform information are different between the first envelope information P1 and the second envelope information P2.

Start time t6 (second timing) of a waveform signal generation period Tma of the event-specific force amplitude envelope 71Ma is between start time t5 (first timing) of a waveform signal generation period Tpc of the event-specific force amplitude envelope 71Pc and end time t7 of the waveform signal generation period Tpc. Note that the start time t6 is time after a half cycle of the waveform signal 75f from the start time t5 in FIG. 11.

As illustrated in FIG. 6 and FIG. 11, when confirming that the waveform signal generation periods overlap, the current amplitude calculation unit 33 generates a composite envelope 72b by synthesizing (overlapping) the event-specific force amplitude envelope 71Pc and the event-specific force amplitude envelope 71Ma.

Here, the composite envelope 72b has the same amplitude as the amplitude of the event-specific force amplitude envelope 71Pc from the start time t5 to the start time t6. Further, the composite envelope 72b has an amplitude obtained by adding up the amplitude of the event-specific force amplitude envelope 71Pc and the amplitude of the event-specific force amplitude envelope 71Ma, that is, zero amplitude from the start time t6 to the end time t7. Further, the composite envelope 72b has the same amplitude as the amplitude of the event-specific force amplitude envelope 71Ma from the end time t7 to end time t8 of the waveform signal generation period Tma.

The current amplitude calculation unit 33 is configured to acquire a value of the envelope current amplitude of the composite envelope 72b, and to output the acquired value of the envelope current amplitude to the modulation unit 35.

Figure 12:
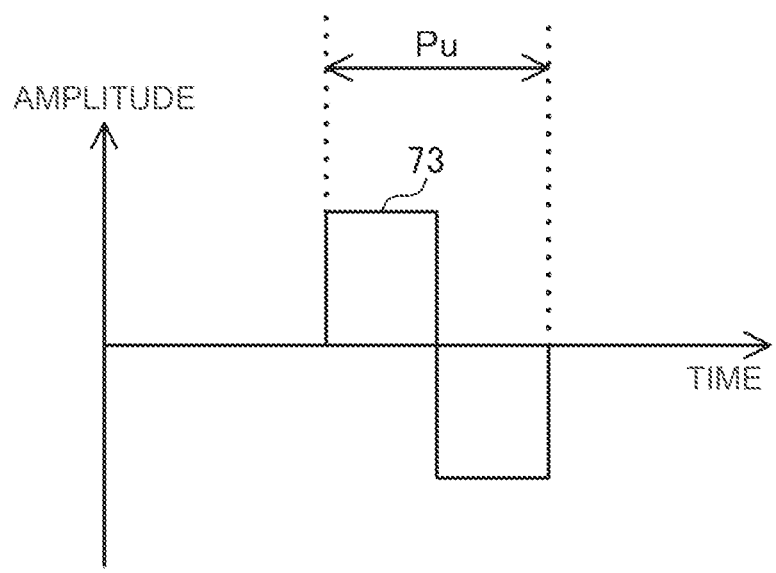
FIG. 12 is a graph illustrating an example of a unit force wave held by the signal generation device according to the first exemplary embodiment.
Figure 13:
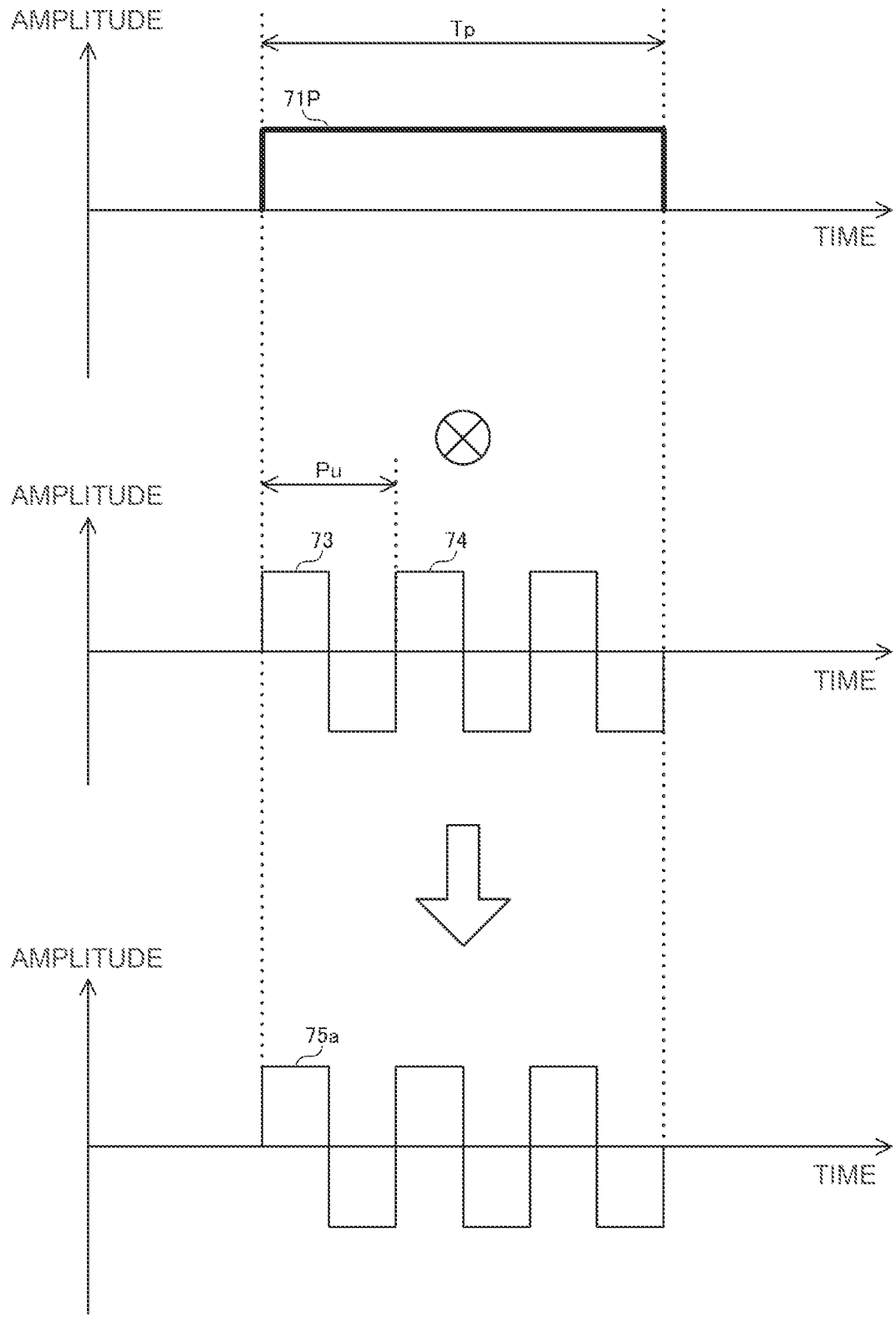
FIG. 13 is a graph illustrating an example of a waveform signal when waveform signal generation periods do not overlap according to the first exemplary embodiment.

FIG. 12 is a graph illustrating an example of a unit force wave held by the signal generation device according to the first exemplary embodiment. FIG. 13 is a graph illustrating an example of a waveform signal when waveform signal generation periods do not overlap according to the first exemplary embodiment. Note that in FIG. 12 and FIG. 13, the horizontal axis indicates time and the vertical axis indicates amplitude.

As illustrated in FIG. 12 and FIG. 13, a force wave 74 has a cycle Pu in the present embodiment. Further, the force wave 74 is a wave vibrating during the waveform signal generation periods Tp, Tpa, Tpb, Tpc, and Tma. In FIG. 12, one cycle of a force wave, which may also be called a "unit force wave 73", is illustrated. In the present embodiment, the force wave 74 is a square wave having the cycle Pu. Note that the shape of the unit force wave 73 is not limited to the square wave, and it may have any other shape.

As illustrated in FIG. 6 and FIG. 12, for example, unit force wave information indicative of the cycle and shape of the unit force wave 73 is prestored on the disk 14. The unit force wave information is data for creating the waveform of a force wave, for example, which is specifically data in which pairs of times and amplitudes at respective times are arranged in chronological order. Note that, for example, when the waveform of the force wave is generated by a spline curve, the unit force wave information may also be data indicative of pairs of times at control points used for the spline curve and amplitudes at the times. The unit force wave information acquiring unit 36 acquires the unit force wave information from the disk 14, and outputs the acquired unit force wave information to the modulation unit 35.

For example, in the case where the current amplitude calculation unit 33 confirms that the waveform signal generation periods do not overlap, the event-specific force amplitude envelope 71P, the force wave 74, and the waveform signal 75a when the value of the envelope current amplitude of the event-specific force amplitude envelope 71P (see FIG. 8) is output to the modulation unit 35 are illustrated in FIG. 13.

Figure 14:
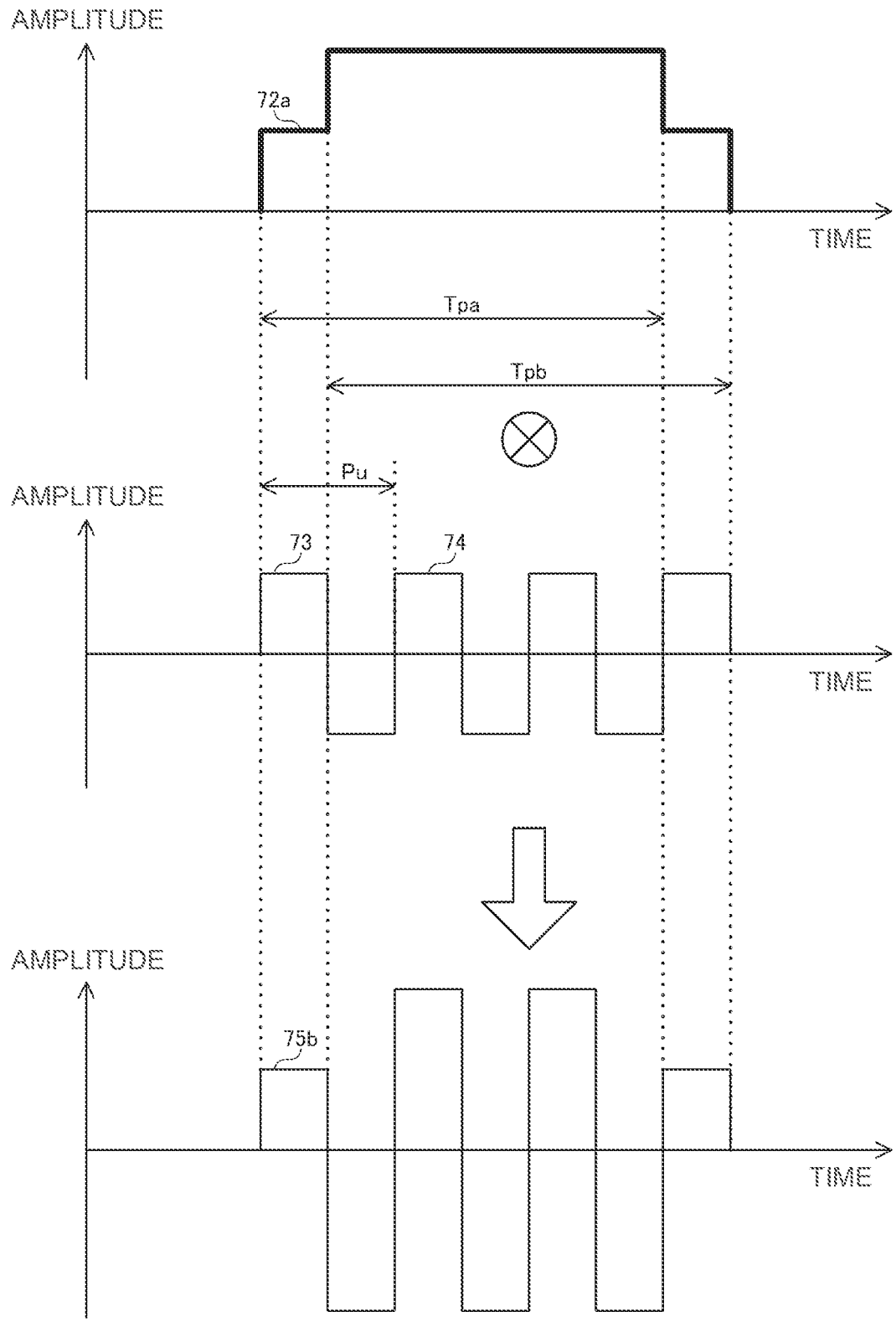
FIG. 14 is a graph illustrating an example of a waveform signal when waveform signal generation periods overlap according to the first exemplary embodiment.

FIG. 14 is a graph illustrating an example of a waveform signal when waveform signal generation periods overlap according to the first exemplary embodiment. Note that each horizontal axis indicates time and each vertical axis indicates amplitude in FIG. 14. In FIG. 14, for example, the composite envelope 72a, the force wave 74, and the waveform signal 75b are illustrated when the value of the envelope current amplitude of the composite envelope 72a (see FIG. 10) is output to the modulation unit 35 in the case where the current amplitude calculation unit 33 confirms that the waveform signal generation periods overlap.

Figure 15:
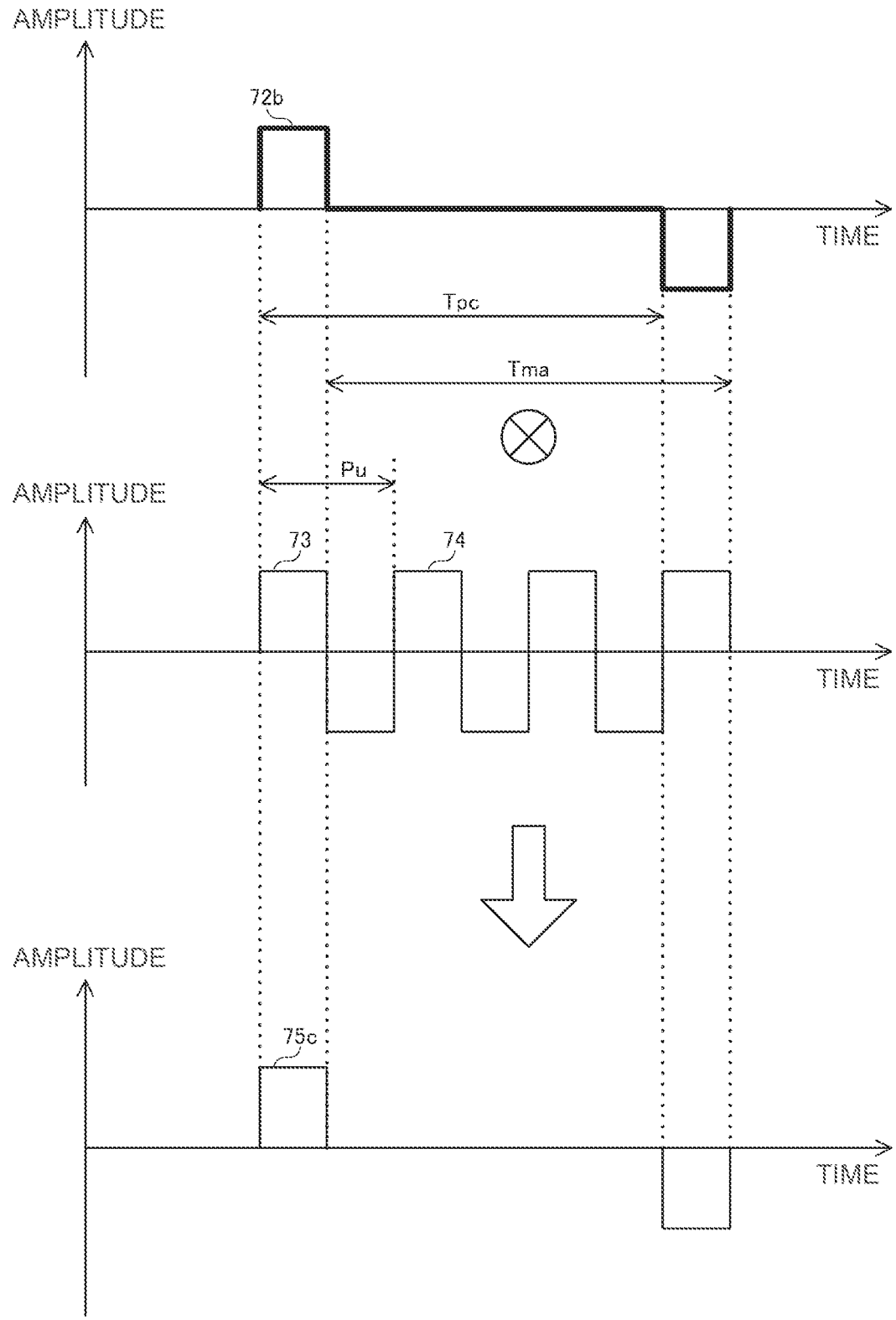
FIG. 15 is a graph illustrating an example of a waveform signal when the waveform signal generation periods overlap according to the first exemplary embodiment.

FIG. 15 is a graph illustrating an example of a waveform signal when the waveform signal generation periods overlap according to the first exemplary embodiment. Note that each horizontal axis indicates time and each vertical axis indicates amplitude in FIG. 15. In FIG. 15, for example, the composite envelope 72b, the force wave 74, and a waveform signal 75c are illustrated when the value of the envelope current amplitude of the composite envelope 72b (see FIG. 11) is output to the modulation unit 35 in the case where the current amplitude calculation unit 33 confirms that the waveform signal generation periods overlap.

As illustrated in FIG. 6 and FIG. 12 to FIG. 15, the modulation unit 35 modulates a periodic force wave by the composite envelope to generate a waveform signal. In the present embodiment, the modulation unit 35 is configured to receive unit force wave information from the unit force wave information acquiring unit 36 to generate the unit force wave 73 based on the received unit force wave information. The modulation unit 35 generates the unit force wave 73 every cycle Pu to generate the force wave 74 in which the unit force wave 73 is continuous (see FIG. 13 to FIG. 15).

The modulation unit 35 modulates the force wave 74 by the value of the envelope current amplitude of the event-specific force amplitude envelope 71P, the composite envelope 72a, or the composite envelope 72b received from the current amplitude calculation unit 33 as the current time elapses to generate the waveform signal 75a, 75b, or 75c, respectively. The modulation in the modulation unit 35 is, for example, digital modulation in an exemplary aspect, but can also be analog modulation in another exemplary aspect. The modulation unit 35 acquires a value of the amplitude of the generated waveform signal 75a, 75b, or 75c at the current time, which may also be called a "signal current amplitude", and outputs the acquired value to the output unit 37.

When receiving the value of the signal current amplitude from the modulation unit 35, the output unit 37 digitally encodes the received value of the signal current amplitude to generate haptic information, and transmits the generated haptic information to the controller 21 via the communication interface 17.

As illustrated in FIG. 10, in such a configuration that the waveform signal 75d and the waveform signal 75e are simply overlapped and synthesized, the waveform signal 75d and the waveform signal 75e interfere to weaken each other. On the contrary, when the start time t2 of the waveform signal generation period Tpb is later than the start time t1 of the waveform signal generation period Tpa and earlier than the end time t3, the composite envelope 72a can keep a convex shape protruding in the positive direction regardless of the difference between the start time t2 and the start time t1.

Then, as illustrated in FIG. 14, since such a configuration as to modulate the force wave 74 by the composite envelope 72a can generate the waveform signal 75b, the user 6 can perceive such an expected force sense of being pulled forward in two stages regardless of the difference between the start time of the first event and the start time of the second event. Namely, Problem 1 can be solved.

Further, as illustrated in FIG. 11, such a configuration that the waveform signal 75f and the waveform signal 75g are simply overlapped and synthesized causes the waveform signal 75f and the waveform signal 75g to interfere to strengthen each other.

On the contrary, when the start time t6 of the waveform signal generation period Tma is later than the start time t5 of the waveform signal generation period Tpc and earlier than the end time t7, the composite envelope 72b can keep such a shape that the amplitude between the start time t6 and the end time t7 becomes zero regardless of the difference between the start time t6 and the start time t5. Then, as illustrated in FIG. 15, since such a configuration that the force wave 74 is modulated by the composite envelope 72b can generate the waveform signal 75c, the user 6 can perceive the expected weak force sense regardless of the difference between the start time of the first event and the start time of the second event. In other words, Problem 2 can be solved. Thus, the force sense perceived by the user 6 can be stabilized regardless of the start times of two or more events.

[Signal Generation Processing]

Figure 16:
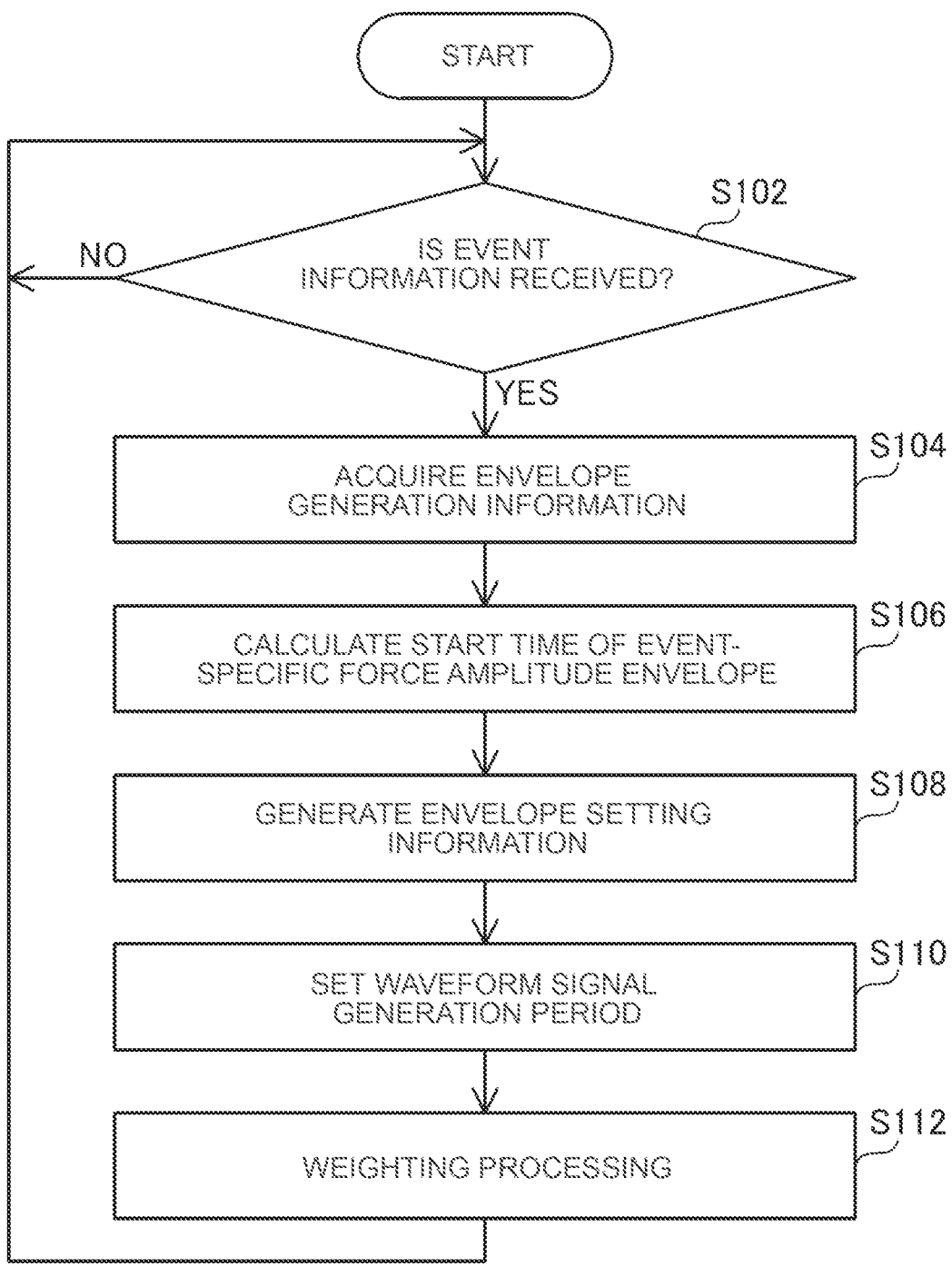
FIG. 16 is a flowchart defining an operation procedure when the signal generation device according to the first exemplary embodiment performs event information processing.

FIG. 16 is a flowchart defining an operation procedure when the signal generation device according to the first exemplary embodiment performs event information processing.

As illustrated in FIG. 16, the event reception unit 31 in the signal generation device 1 first waits for reception of event information from the game program (NO in step S102).

Next, when receiving the event information from the game program (YES in step S102), the event reception unit 31 outputs the received event information to the envelope generation information acquisition unit 32. When receiving the event information from the event reception unit 31, the envelope generation information acquisition unit 32 acquires, from the disk 14, envelope generation information corresponding to the ID of the event indicated by the received event information (step S104).

Next, based on the acquired envelope generation information and event information, the envelope generation information acquisition unit 32 calculates time to start the event-specific force amplitude envelope (step S106).

Next, based on the envelope generation information, the envelope generation information acquisition unit 32 generates envelope setting information including the time to start the event-specific force amplitude envelope, the envelope waveform information, and the weighting information, and outputs the generated envelope setting information to the current amplitude calculation unit 33 (step S108).

Next, when receiving the envelope setting information from the envelope generation information acquisition unit 32, the current amplitude calculation unit 33 sets a waveform signal generation period based on the envelope setting information (step S110).

Next, based on the weighting information included in the envelope setting information, the current amplitude calculation unit 33 weights the amplitude of the event-specific force amplitude envelope indicated by the envelope waveform information included in the envelope setting information (step S112).

Next, the event reception unit 31 waits for reception of new event information from the game program (NO in step S102).

Note that the order of step S110 and step S112 is not limited to that mentioned above, and the order may be changed.

Figure 17:
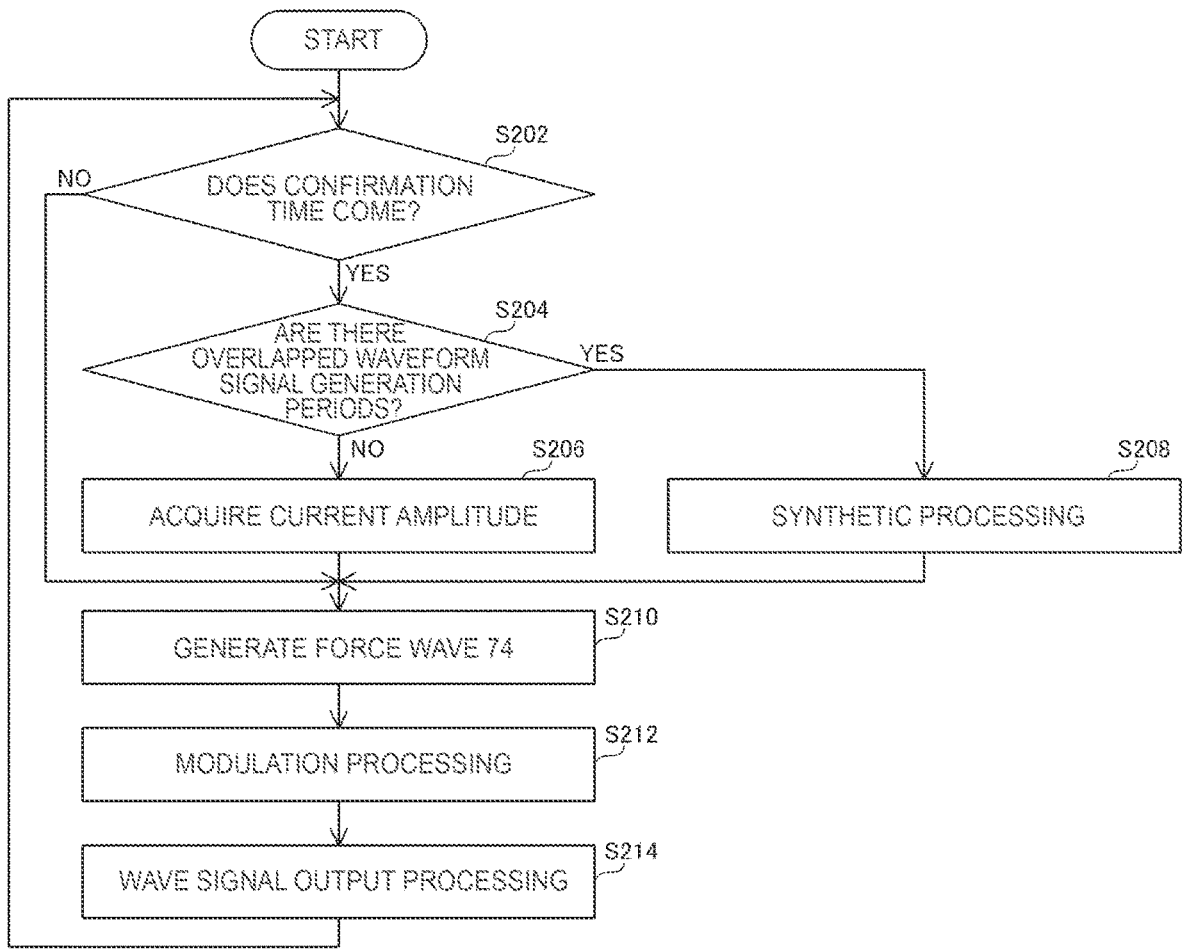
FIG. 17 is a flowchart defining an operation procedure when the signal generation device according to the first exemplary embodiment performs waveform signal generation processing.

FIG. 17 is a flowchart defining an operation procedure when the signal generation device according to the first exemplary embodiment performs waveform signal generation processing.

As illustrated in FIG. 17, when the confirmation time comes (YES in step S202), the current amplitude calculation unit 33 in the signal generation device 1 confirms whether or not there are waveform signal generation periods that overlap each other (step S204).

When confirming that there are no waveform signal generation periods that overlap each other (NO in step S204), the current amplitude calculation unit 33 acquires the envelope current amplitude of the event-specific force amplitude envelope, and outputs a value of the envelope current amplitude to the modulation unit 35 (step S206).

On the other hand, when there are waveform signal generation periods that overlap each other, the current amplitude calculation unit 33 performs synthetic processing for generating a composite envelope, acquiring an envelope current amplitude of the composite envelope, and outputting a value of the envelope current amplitude to the modulation unit 35 (step S208). The details of the synthetic processing will be described in detail below.

Next, when the confirmation time does not come (NO in step S202) or when the value of the envelope current amplitude is output to the modulation unit 35 (step S206 and S208), the modulation unit 35 generates the unit force wave 73 every cycle Pu based on the unit force wave information received from the unit force wave information acquiring unit 36 to generate the force wave 74 (step S210).

Next, the modulation unit 35 modulates the force wave 74 by the value of the envelope current amplitude received from the current amplitude calculation unit 33 to generate a waveform signal. The modulation unit 35 acquires a value of the signal current amplitude of the waveform signal and outputs the value of the signal current amplitude to the output unit 37 (step S212).

Next, when receiving the value of the signal current amplitude from the modulation unit 35, the output unit 37 digitally encodes the received value of the signal current amplitude to generate haptic information, and transmits the generated haptic information to the controller 21 via the communication interface 17 (step S214).

The processes from step S210 to step S214 are repeated until the current amplitude calculation unit 33 confirms that a new confirmation time comes (NO in step S202).

Figure 18:
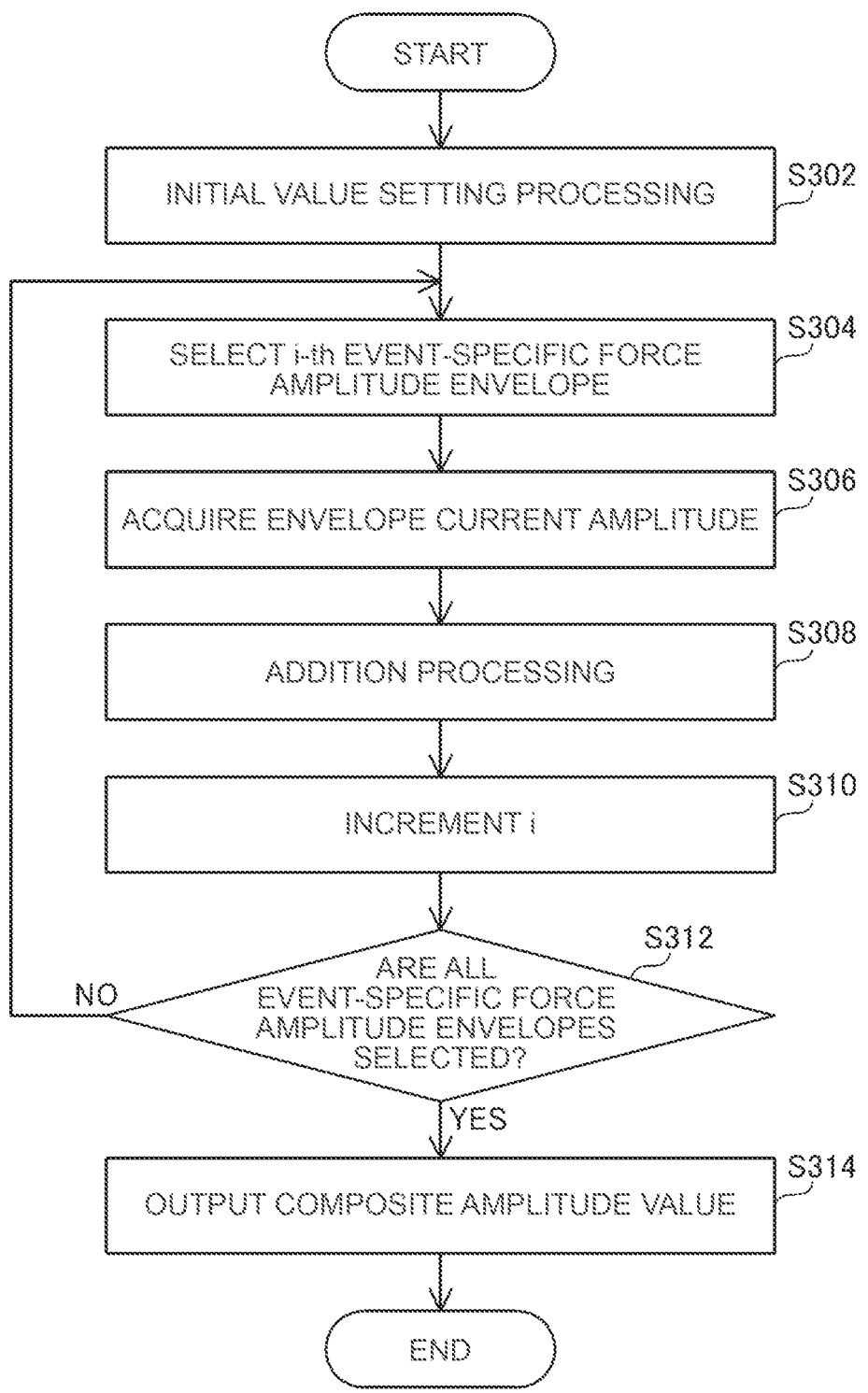
FIG. 18 is a flowchart defining an operation procedure when the signal generation device according to the first exemplary embodiment performs synthetic processing.

FIG. 18 is a flowchart defining an operation procedure when the signal generation device according to the first exemplary embodiment performs the synthetic processing. FIG. 18 illustrates the details of the operation in step S208 of FIG. 17.

As illustrated in FIG. 18, for example, such a situation that N (an integer of 2 or greater) waveform signal generation periods overlap each other is assumed. N event-specific force amplitude envelopes correspond to the N waveform signal generation periods, respectively.

First, for example, the current amplitude calculation unit 33 in the signal generation device 1 performs initial value setting processing for setting an integer i to 1 and resetting a composite amplitude value to zero (step S302).

Next, the current amplitude calculation unit 33 selects the i-th event-specific force amplitude envelope corresponding to the i-th waveform signal generation period among the N waveform signal generation periods (step S304).

Next, the current amplitude calculation unit 33 acquires an envelope current amplitude of the i-th event-specific force amplitude envelope (step S306).

Next, the current amplitude calculation unit 33 performs addition processing to add the acquired envelope current amplitude to the composite amplitude value (step S308).

Next, the current amplitude calculation unit 33 increments the integer i (step S310).

Next, the current amplitude calculation unit 33 confirms whether or not all the N event-specific force amplitude envelopes are selected (step S312). Specifically, the current amplitude calculation unit 33 confirms whether or not the integer i is larger than N.

Next, when all the N event-specific force amplitude envelopes are not selected, that is, when integer i is N or less (NO in step S312), the current amplitude calculation unit 33 selects the i-th event-specific force amplitude envelope corresponding to the i-th waveform signal generation period among the remaining waveform signal generation periods (step S304).

On the other hand, when all the N event-specific force amplitude envelopes are selected, that is, when the integer i is larger than N (YES in step S312), the current amplitude calculation unit 33 outputs, to the modulation unit 35, the composite amplitude value, that is, a value of the envelope current amplitude of the composite envelope (step S314). Thus, the synthetic processing is ended.

Although the weighting information is described as static information included in the correspondence information 101 prestored on the disk 14 in the signal generation device 1 of the present embodiment, the weighting information may also be dynamic information in an alternative aspect. Specifically, for example, the game program may also be configured to be able to rewrite the weighting information. In this case, since a value indicated by the weighting information can be changed according to the situation of the game, the priority of haptic presentation can be set for each event to change the priority according to the situation of the game or adjust the intensity of a force sense according to the situation of the game.

Further, in the signal generation device 1 of the present embodiment, such a configuration that the envelope generation information acquisition unit 32 acquires the envelope generation information from the disk 14 to generate an event-specific force amplitude envelope is described, but the envelope generation information acquisition unit 32 may also be configured to generate multiple patterns of event-specific force amplitude envelopes in advance and held in the memory 13 in order to read, from the memory 13, an event-specific force amplitude envelope as needed.

Further, in the signal generation device 1 of the present embodiment, such a configuration that the current amplitude calculation unit 33 generates a composite envelope by synthesizing two weighted event-specific force amplitude envelopes, and acquires a value of the envelope current amplitude based on the generated composite envelope is described, but it should be appreciated that the present invention is not limited thereto. The current amplitude calculation unit 33 may also perform processing below when two event-specific force amplitude envelopes are synthesized without being weighted to generate a composite envelope and a value of the envelope current amplitude is acquired from the generated composite envelope. In other words, the current amplitude calculation unit 33 may also be configured to weight the amplitude of each of event-specific force amplitude envelopes that constitute the composite envelope, respectively, in order to acquire a value of the envelope current amplitude by adding the respective weighted amplitudes.

Further, in the signal generation device 1 of the present embodiment, such a configuration that the current amplitude calculation unit 33 synthesizes the two weighted event-specific force amplitude envelopes and uses the composite envelop as it is described, but it should be appreciated that the present invention is not limited thereto. For example, the current amplitude calculation unit 33 may also perform limiter processing to limit the upper limit of the composite envelope or perform processing to adjust the shape of the composite envelope.

Further, in the signal generation device 1 of the present embodiment, such a configuration that the modulation unit 35 outputs, to the output unit 37, the generated waveform signal as it is described, but it should be appreciated that the present invention is not limited thereto. For example, the modulation unit 35 may also perform limiter processing to limit the upper limit of the waveform signal.

Further, in the signal generation device 1 of the present embodiment, another waveform signal may also be superimposed on the waveform signal based on the composite envelope output by the signal generation device 1.

Further, such a configuration that the signal generation device 1 of the present embodiment generates a waveform signal to cause the controller 21 to vibrate according to the event in the virtual reality is described, but it is noted that the exemplary embodiment of the present invention is not limited thereto. For example, when remotely operating an operation target, such as a construction machine, a vehicle, or an airplane using a controller, the signal generation device 1 may be configured to generate a waveform signal to cause the controller to vibrate according to a real event in the operation target.

Further, in the signal generation device 1 of the present embodiment, such a configuration that the current amplitude calculation unit 33 generates the composite envelope 72a obtained by synthesizing the event-specific force amplitude envelopes 71Pa and 71Pb based, for example, on the first envelope information P1 and the second envelope information P2 is described, but it should be appreciated that the present invention is not limited thereto. The current amplitude calculation unit 33 may also be configured to synthesize three or more event-specific force amplitude envelopes indicative of three or more pieces of envelope information, respectively, based on the three or more pieces of envelope information in order to generate a composite envelope.

Second Exemplary Embodiment

A game system of a second embodiment will be described. Description of matters common to those in the first embodiment will be omitted in the second embodiment, and only different points will be described. In particular, similar actions and effects of similar configurations are not mentioned sequentially for each embodiment.

In the game system according to the first embodiment, such a configuration that the force wave 74 is generated using the unit force wave 73 prestored on the disk 14 is described, but the game system according to the second embodiment is different from the game system according to the first embodiment in that the unit force wave used to generate a force wave can be changed.

[Problems]

In the game system 3 according to the first embodiment, since the waveform signal is generated by the force wave 74 based on the predetermined unit force wave 73, there is a case where it may be difficult to obtain a force sense that satisfies the user 6.

For details, force senses given to the user 6 are different between when the waveform signal is generated using the unit force wave 73 of the square wave and when the waveform signal is generated using a unit force wave having a shape different from that of the unit force wave 73 of the square wave.

Further, the satisfaction of the user 6 about the force sense varies depending, for example, on the hand sensitivity, the skin thickness, age, gender, the physical and mental states, and the usage time such as morning, afternoon, and night. Further, the user 6 has tastes and preferences about the feeling of the force sense, the intensity of stimulus, the quietness, and the power consumption.

In other words, in the game system 3 according to the first embodiment, since the unit force wave used to generate a waveform signal is fixed despite the fact that the unit force wave to give a highly satisfied force sense to the user 6 is different depending on the user 6, it was difficult to improve the satisfaction of the user 6 who was dissatisfied with the force sense based on the unit force wave.

FIG. 19 is a graph illustrating an example of candidate unit force waves stored on the disk according to the second exemplary embodiment. Note that each horizontal axis indicates time and each vertical axis indicates amplitude in FIG. 19. In FIG. 19, unit force waves 73, 73a, and 73b of candidate unit force waves as candidates of a unit force wave used to generate a force wave to be modulated by an envelope of a waveform signal are illustrated.

As illustrated in FIG. 19, the unit force waves 73, 73a, and 73b have the same shape. Here, the fact that two unit force waves have "the same shape" means that one unit force wave is expanded or shrunk independently in the time axis direction and the amplitude axis direction, respectively, so that the waveform of one unit force wave after being expanded or shrunk and the waveform of the other unit force wave can be made to match each other. In the present embodiment, the unit force waves 73, 73a, and 73b are square waves. On the other hand, the unit force waves 73, 73a, and 73b are different in fundamental frequency.

For details, the unit force wave 73 is the same square wave as the unit force wave 73 illustrated in FIG. 12. The unit force wave 73a has a cycle Pu1 shorter than the cycle Pu of the unit force wave 73. In other words, the unit force wave 73a has a fundamental frequency higher than the fundamental frequency of the unit force wave 73.

The unit force wave 73b has a cycle Pu2 longer than the cycle Pu of the unit force wave 73. In other words, the unit force wave 73b has a fundamental frequency lower than the fundamental frequency of the unit force wave 73.

FIG. 20 is a graph illustrating an example of candidate unit force waves stored on the disk according to the second exemplary embodiment. Note that each horizontal axis indicates time and each vertical axis indicates amplitude in FIG. 20. In FIG. 20, unit force waves 73, 83, and 84 are illustrated as candidate unit force waves.

As illustrated in FIG. 20, the unit force waves 73, 83, and 84 have the same cycle Pu, that is, they have the same fundamental frequency. On the other hand, the unit force waves 73, 83, and 84 have different shapes. Here, the fact that two unit force waves have "different shapes" means that one unit force wave is expanded or shrunk independently in the time axis direction and the amplitude axis direction, respectively, so that the waveform of one unit force wave after being expanded or shrunk and the waveform of the other unit force wave cannot be made to match each other. Specifically, each of the unit force waves 73, 83, and 84 is a square wave, a sawtooth wave, and a triangle wave, respectively.

According to various exemplary aspects, it is noted that each unit force wave may have any shape as long as it is a periodic wave. For example, the shape of the unit force wave may be a waveform shape, such as a sawtooth wave, a square wave, or a triangle wave, or a waveform shape obtained by part or all of a sign wave is combined.

FIG. 21 is a graph illustrating an example of candidate unit force waves stored on the disk according to the second exemplary embodiment. Note that each horizontal axis indicates time and each vertical axis indicates amplitude in FIG. 21. In FIG. 21, unit force waves 73, 73c, and 73d are illustrated as candidate unit force waves.

As illustrated in FIG. 21, the unit force waves 73, 73c, and 73d have the same cycle Pu, that is, they have the same fundamental frequency. Further, the unit force waves 73, 73c, and 73d have the same shape. In the present embodiment, the unit force waves 73, 73c, and 73d are square waves. On the other hand, the unit force waves 73, 73c, and 73d are different in terms of the smoothness of the waveform shape.

For details, the unit force wave 73 is the same square wave as the unit force wave 73 illustrated in FIG. 12, FIG. 19, and FIG. 20. The unit force wave 73c is a square wave with rounded corners, for example, by reducing a high frequency component from the unit force wave 73. The unit force wave 73d is a square wave with further rounded corners, for example, by reducing a high frequency component from the unit force wave 73c.

Note that the cases where the smoothness of the shapes of the square waves are different are described in the present embodiment, but the unit force waves made different in terms of smoothness are not limited to square waves, and they may also have any other shapes as long as they are periodic waves.

As illustrated in FIG. 2, for example, seven pieces of candidate information respectively indicative of unit force waves 73, 73a, 73b, 73c, 73d, 83, and 84 are stored on the disk 14. Each piece of candidate information is managed, for example, by an index. Note that the candidate information stored on the disk 14 is not limited to these seven pieces of candidate information, and candidate information indicative of any other unit force wave may also be stored. Further, for example, the candidate information has the same data format as the unit force wave information.

[Configuration of Force Wave Determination Device]

Figure 22:
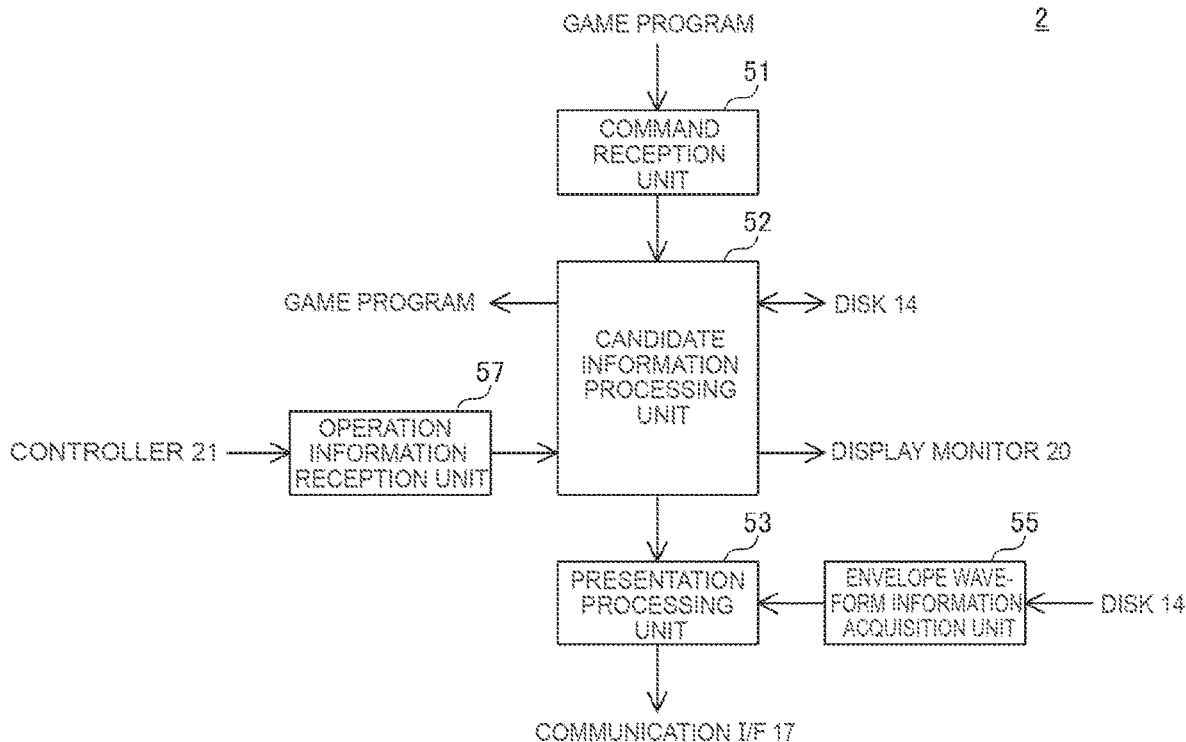
FIG. 22 is a block diagram illustrating the configuration of a force wave determination device according to the second exemplary embodiment.

FIG. 22 is a block diagram illustrating the configuration of a force wave determination device according to the second exemplary embodiment. For example, a force wave determination device 2 is implemented by causing the CPU 12 in the computer 11 to execute a force wave determination program, as an example of the target program. The force wave determination device 2 includes, as functional blocks, a command reception unit 51, a candidate information processing unit 52 (e.g., a candidate information acquisition unit and a determination unit), a presentation processing unit 53, an envelope waveform information acquisition unit 55, and an operation information reception unit 57 (a selection result acquisition unit).

The game program, as described above with respect to FIG. 1, for example, controls the GPU 16, for example, to cause the user 6 to select a unit force wave, and displays, on the display monitor 20, a game content setting screen for tuning haptics or a game system setting screen. At this time, the game program outputs a force wave determination processing execution command to the command reception unit 51.

When receiving the force wave determination processing execution command from the game program, the command reception unit 51 launches the force wave determination program and outputs the force wave determination processing execution command to the candidate information processing unit 52.

When receiving the force wave determination processing execution command from the command reception unit 51, the candidate information processing unit 52 acquires, from the disk 14, two pieces of candidate information from among multiple pieces of candidate information stored on the disk 14.

The two pieces of candidate information are candidate information for generating waveform signals, for example, to give very different stimuli. Specifically, the two pieces of candidate information are first candidate information for generating a waveform signal to give a strong stimulus and second candidate information for generating a waveform signal to give a weak stimulus. Note that the two pieces of candidate information may also candidate information for generating waveform signals to give very different degrees of quietness. Further, the two pieces of candidate information may be candidate information for generating waveform signals to give very different degrees of power consumption or base frequency, or the smoothness of waveform shapes, which are not limited to giving stimuli and quietness.

For example, the candidate information processing unit 52 outputs the first candidate information to the presentation processing unit 53. At this time, the candidate information processing unit 52 may control the GPU 16 to display, on the display monitor 20, that it is causing the controller 21 to generate a vibration, which may also be called a "first candidate vibration", based on a unit force wave indicated by the first candidate information.

The envelope waveform information acquisition unit 55 refers to the correspondence information 101 (see FIG. 7) stored on the disk 14 to acquire envelope waveform information from the disk 14. The envelope waveform information acquired by the envelope waveform information acquisition unit 55 is, for example, envelope waveform information corresponding to an event ID defined by default. Note that the envelope waveform information may also be designated by the game program. The envelope waveform information acquisition unit 55 outputs the acquired envelope waveform information to the presentation processing unit 53.

When receiving the first candidate information from the candidate information processing unit 52, the presentation processing unit 53 generates haptic information based on the first candidate information and the envelope waveform information received from the envelope waveform information acquisition unit 55, and transmits the generated haptic information to the controller 21 via the communication interface 17. Thus, the first candidate vibration occurs to the controller 21.

When a predetermined waiting time W passes after the first candidate information is output to the presentation processing unit 53, the candidate information processing unit 52 outputs the second candidate information to the presentation processing unit 53. Thus, a vibration, which may also be called a "second candidate vibration", based on the unit force wave indicated by the second candidate information occurs to the controller 21. At this time, the candidate information processing unit 52 may also control the GPU 16 to display, on the display monitor 20, that it is causing the controller 21 to generate the second candidate vibration.

Here, for example, the waiting time W is set longer than the length of the waveform signal generation period of the event-specific force amplitude envelope indicated by the envelope waveform information. This configuration can prevent the first candidate vibration and the second candidate vibration from occurring at the same time.

When the waiting time W passes after the second candidate information is output to the presentation processing unit 53, the candidate information processing unit 52 controls the GPU 16 to display, on the display monitor 20, that the user 6 is urged to select either one of the first candidate vibration that first occurred and the second candidate vibration that last occurred.

Figure 23:
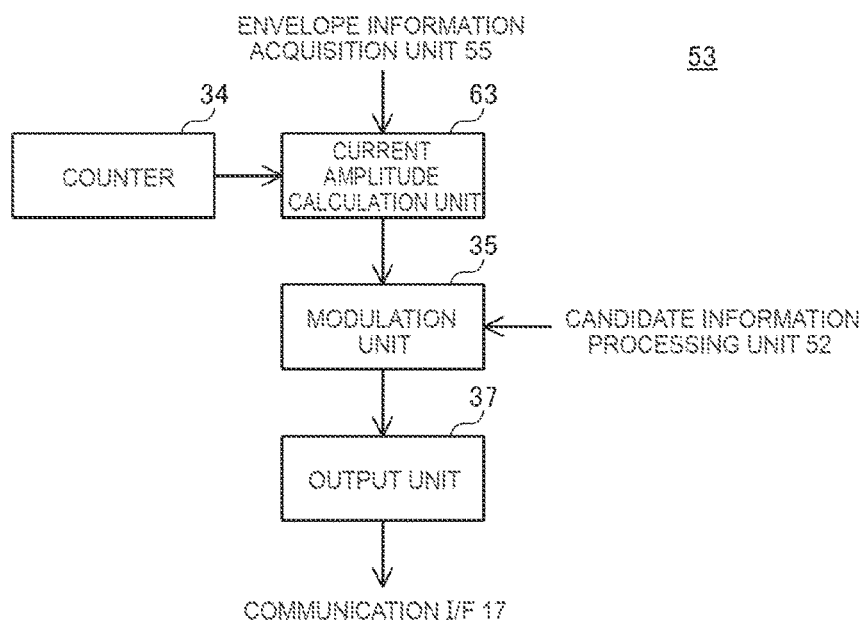
FIG. 23 is a block diagram illustrating the configuration of a presentation processing unit in the force wave determination device according to the second exemplary embodiment.
Figure 24:
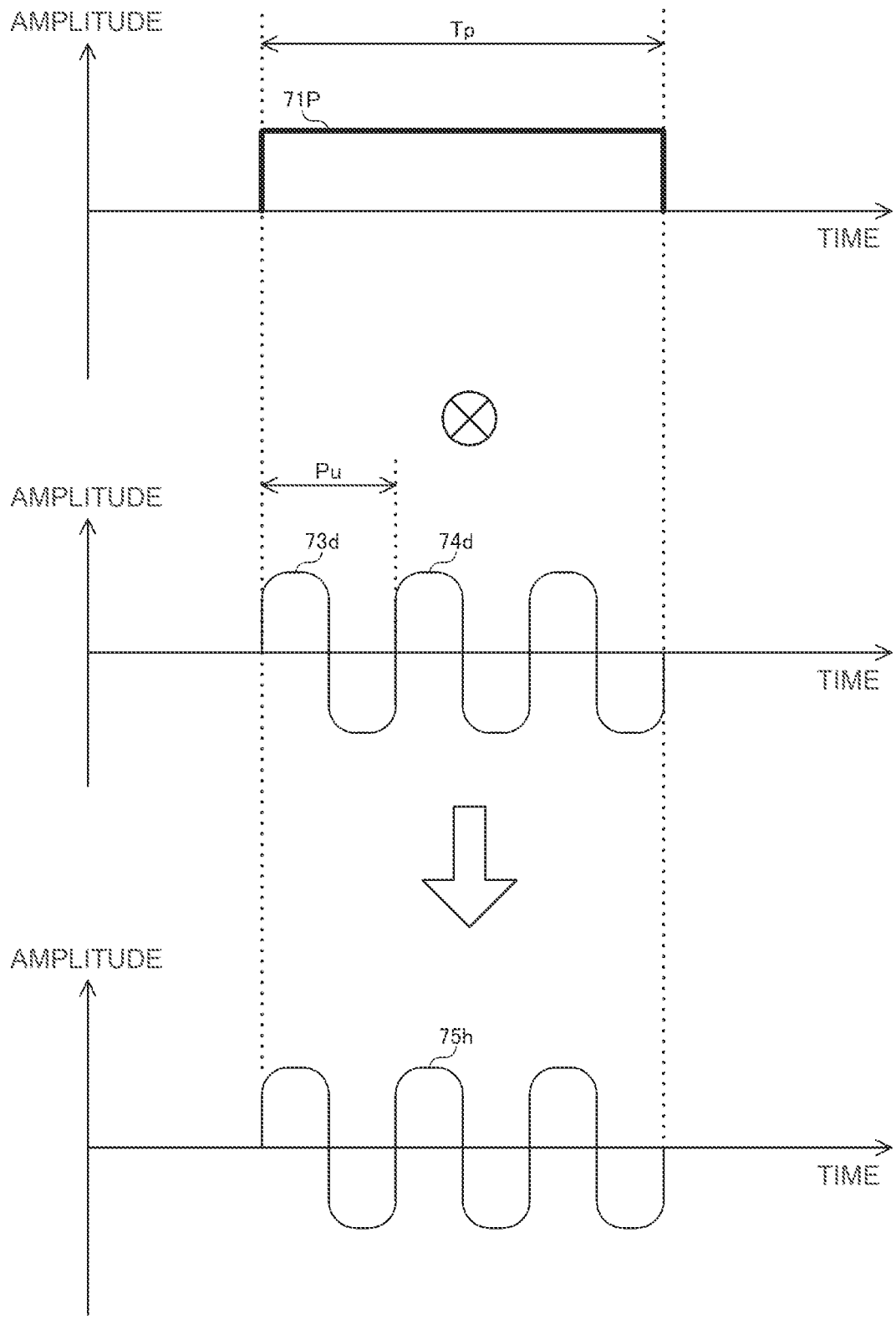
FIG. 24 is a graph illustrating an example of an event-specific force amplitude envelope, a second candidate force wave, and a waveform signal according to the second exemplary embodiment.

FIG. 23 is a block diagram illustrating the configuration of a presentation processing unit in the force wave determination device according to the second exemplary embodiment. FIG. 24 is a graph illustrating an example of an event-specific force amplitude envelope, a second candidate force wave, and a waveform signal according to the second exemplary embodiment. Note that each horizontal axis indicates time and each vertical axis indicates amplitude in FIG. 24. In FIG. 24, the event-specific force amplitude envelope 71P illustrated in FIG. 13, a force wave 74d, and a waveform signal 75h are illustrated.

As illustrated in FIG. 13, FIG. 23, and FIG. 24, the presentation processing unit 53 includes, as functional blocks, the counter 34, the modulation unit 35, the output unit 37 (e.g., a vibration generation unit), and a current amplitude calculation unit 63.

When receiving the envelope waveform information from the envelope waveform information acquisition unit 55, the current amplitude calculation unit 63 monitors the counted value of the counter 34, that is, the current time, and when the confirmation time comes, the current amplitude calculation unit 63 acquires a value of the envelope current amplitude of an event-specific force amplitude envelope (for example, the event-specific force amplitude envelope 71P illustrated in FIG. 13 and FIG. 24) indicated by the envelope waveform information. The current amplitude calculation unit 63 outputs the acquired value of the envelope current amplitude to the modulation unit 35.

When receiving the first candidate information from the candidate information processing unit 52, the modulation unit 35 generates a unit force wave (for example, the unit force wave 73 illustrated in FIG. 13) indicated by the first candidate information every cycle (for example, every cycle Pu) to generate a force wave (hereinafter, which may also be called a first candidate force wave) (for example, the force wave 74 illustrated in FIG. 13) in which the unit force wave is continuous.

The modulation unit 35 is configured to modulate the first candidate force wave by the value of the envelope current amplitude received from the current amplitude calculation unit 63 as the current time elapses to generate a waveform signal (hereinafter, which may also be called a first waveform signal) (for example, the waveform signal 75a illustrated in FIG. 13). The modulation unit 35 outputs a value of the signal current amplitude of the first waveform signal to the output unit 37.

Further, when receiving the second candidate information from the candidate information processing unit 52, the modulation unit 35 generates a unit force wave (for example, the unit force wave 73d illustrated in FIG. 21 and FIG. 24) indicated by the second candidate information every cycle (for example, every cycle Pu) to generate a force wave (hereinafter, which may also be called a second candidate force wave) (for example, the force wave 74d illustrated in FIG. 24) in which the unit force wave is continuous.

The modulation unit 35 is also configured to modulate the second candidate force wave by the value of the envelope current amplitude received from the current amplitude calculation unit 63 as the current time elapses to generate a waveform signal (hereinafter, which may also be called a second waveform signal) (for example, the waveform signal 75h illustrated in FIG. 24). The modulation unit 35 outputs a value of the signal current amplitude of the second waveform signal to the output unit 37.

The output unit 37 causes the controller 21 to generate a vibration based on the first waveform signal, that is, the first candidate vibration, and to generate a vibration based on the second waveform signal, that is, the second candidate vibration, respectively. In the present embodiment, when receiving the value of the signal current amplitude from the modulation unit 35, the output unit 37 digitally encodes the received value of the signal current amplitude to generate haptic information, and transmits the generated haptic information to the controller 21 via the communication interface 17.

As illustrated in FIG. 22, the operation information reception unit 57 acquires a selection result(s) of the first candidate vibration and the second candidate vibration by the user 6.

In the present embodiment, the user 6 is looking at the display monitor 20, for example, while holding the controller 21 in hand. Based on the first candidate vibration that first occurred to the controller 21 and the second candidate vibration that last occurred to the controller 21, the user 6 recognizes a force sense by the first candidate vibration (hereinafter, which may also be called a first force sense) and a force sense by the second candidate vibration, which may also be called a "second force sense", respectively.

The user 6 performs an operation on the controller 21 to select a vibration to generate a force sense that suits user's taste and preference between the first force sense and the second force sense. Specifically, the user 6 performs an operation on the controller 21 to select either one of the first candidate vibration that first occurred and the second candidate vibration that last occurred.

The controller 21 generates operation information indicative of the operation result by the user 6, and transmits the operation information to the operation information reception unit 57. When receiving the operation information from the controller 21, the operation information reception unit 57 outputs the received operation information to the candidate information processing unit 52.

The candidate information processing unit 52 determines a force wave based on the operation information acquired by the operation information reception unit 57. In the present embodiment, for example, when the operation information indicates that the first candidate vibration that first occurred is selected by the user 6, the candidate information processing unit 52 discards the second candidate information for generating a waveform signal to give a weak stimulus. Then, the candidate information processing unit 52 acquires, from the disk 14, new second candidate information for generating a waveform signal to give a stimulus slightly stronger than the weak stimulus from among the multiple pieces of candidate information stored on the disk 14.

The candidate information processing unit 52 outputs, to the presentation processing unit 53, the first candidate information that was not discarded. Then, when the waiting time W passes after the first candidate information is output to the presentation processing unit 53, the candidate information processing unit 52 outputs the new second candidate information to the presentation processing unit 53.

On the other hand, for example, when the operation information indicates that the second candidate vibration that last occurred is selected by the user 6, the candidate information processing unit 52 discards the first candidate information for generating a waveform signal to give a strong stimulus. Then, the candidate information processing unit 52 acquires, from the disk 14, new first candidate information for generating a waveform signal to give a stimulus slightly weaker than the strong stimulus from among the multiple pieces of candidate information stored on the disk 14.

The candidate information processing unit 52 outputs the new first candidate information to the presentation processing unit 53. Then, when the waiting time W passes after the new first candidate information is output to the presentation processing unit 53, the candidate information processing unit 52 outputs, to the presentation processing unit 53, the second candidate information that was not discarded.

Further, when a predetermined condition is met, the candidate information processing unit 52 determines that the selection of the unit force wave was sufficiently narrowed down, and determines the unit force wave to be used in the game program. Then, the candidate information processing unit 52 stores (e.g., registers) the candidate information indicative of the unit force wave on the disk 14 as unit force wave information, and outputs, to the game program, determination information indicating that the force wave was determined. For example, when receiving the determination information from the candidate information processing unit 52, the game program controls the GPU 16 to switch the display content of the display monitor 20 from the game content setting screen or the game system setting screen to a game execution screen.

Here, the predetermined condition is, for example, that candidate information for generating a waveform signal to give a stimulus that suits the taste and preference of the user 6 could be determined. Note that the predetermined condition may also be that there was no candidate information to be newly presented among the multiple pieces of candidate information stored on the disk 14.

[Force Wave Determination Processing]

Figure 25:
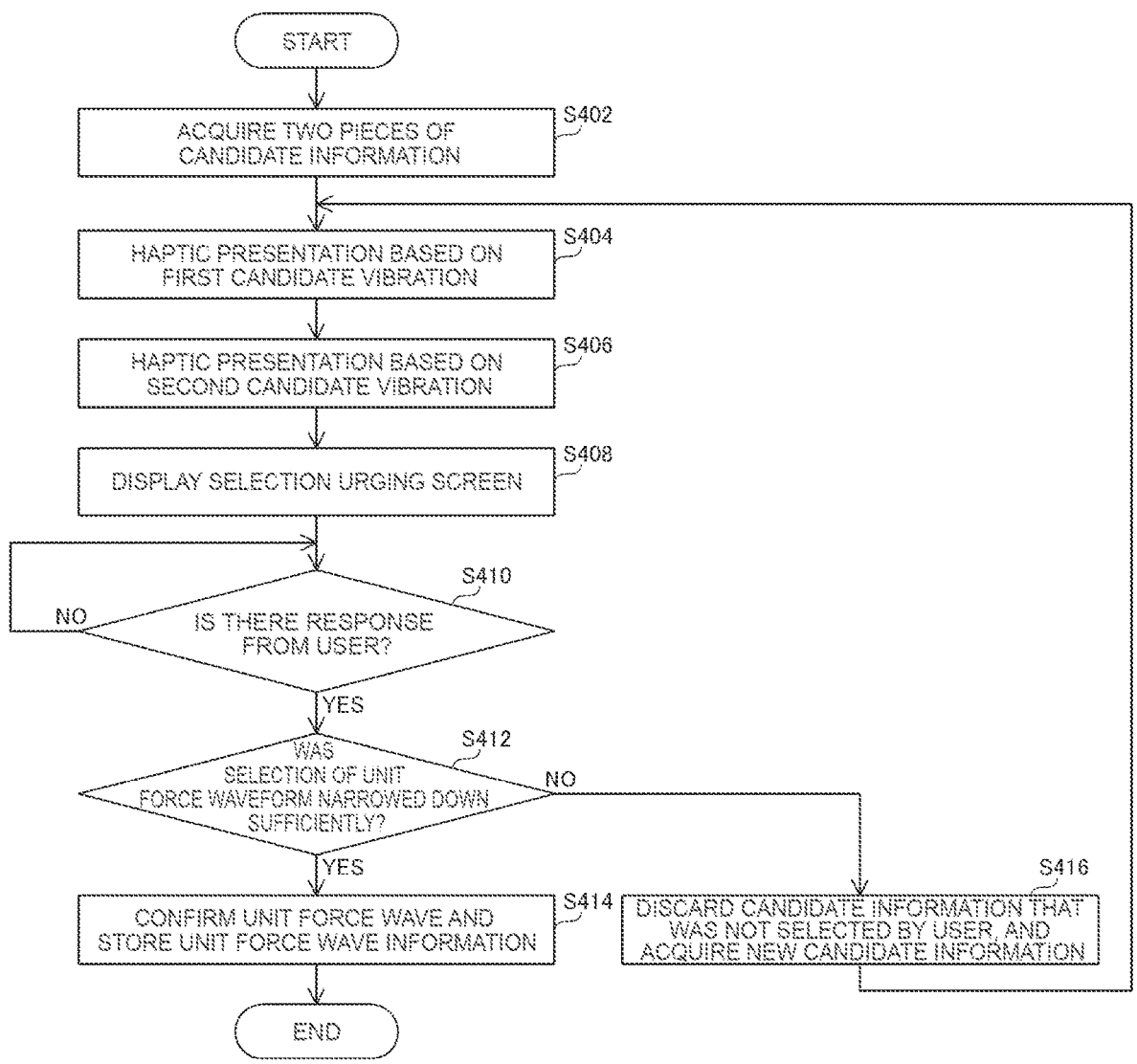
FIG. 25 is a flowchart defining an operation procedure when the force wave determination device according to the second exemplary embodiment performs force wave determination processing.

FIG. 25 is a flowchart defining an operation procedure when the force wave determination device according to the second exemplary embodiment performs force wave determination processing.

As illustrated in FIG. 25, such a situation that the command reception unit 51 in the force wave determination device 2 accepts a force wave determination processing execution command from the game program to launch a force wave determination program is first assumed.

When receiving the force wave determination processing execution command from the command reception unit 51, the candidate information processing unit 52 acquires, from the disk 14, two pieces of candidate information from among the multiple pieces of candidate information stored on the disk 14 (step S402).

Next, the candidate information processing unit 52 outputs, to the presentation processing unit 53, first candidate information of the acquired two pieces of candidate information. When receiving the first candidate information from the candidate information processing unit 52, the presentation processing unit 53 causes the controller 21 to generate a first candidate vibration based on the first candidate information and the envelope waveform information. Thus, haptic presentation based on the first candidate vibration is performed (step S404).

Next, when the waiting time W passes after the first candidate information is output to the presentation processing unit 53, the candidate information processing unit 52 outputs, to the presentation processing unit 53, second candidate information of the acquired two pieces of candidate information. When receiving the second candidate information from the candidate information processing unit 52, the presentation processing unit 53 causes the controller 21 to generate a second candidate vibration based on the second candidate information and the envelope waveform information. Thus, haptic presentation based on the second candidate vibration is performed (step S406).

Next, when the waiting time W passes after the second candidate information is output to the presentation processing unit 53, the candidate information processing unit 52 controls the GPU 16 to display, on the display monitor 20, that the user 6 is urged to select either one of the first candidate vibration that first occurred and the second candidate vibration that last occurred (step S408).

Next, the operation information reception unit 57 waits until operation information is received from the controller 21 (NO in step S410). Then, when receiving operation information from the controller 21 (YES in step S410), the operation information reception unit 57 outputs the received operation information to the candidate information processing unit 52.

Next, when receiving the operation information from the operation information reception unit 57, the candidate information processing unit 52 determines whether or not the selection of the unit force wave was narrowed down sufficiently based on the operation information (step S412).

When determining that the selection of the unit force wave was not sufficiently narrowed down (NO in step S412), the candidate information processing unit 52 discards candidate information that was not selected by the user 6, and acquires new candidate information from the disk 14 (step S416).

Next, the candidate information processing unit 52 outputs, to the presentation processing unit 53, first candidate information from between the new candidate information and the candidate information selected by the user 6. When receiving the first candidate information from the candidate information processing unit 52, the presentation processing unit 53 causes the controller 21 to generate a first candidate vibration based on the first candidate information and the envelope waveform information. Thus, haptic presentation based on the first candidate vibration is performed (step S404).

On the other hand, when determining that the selection of the unit force wave was sufficiently narrowed down (YES in step S412), the candidate information processing unit 52 determines the unit force wave to be used in the game program, and stores candidate information indicative of the unit force wave on the disk 14 as unit force wave information (step S414).

The candidate information processing unit 52 outputs, to the game program, determination information indicating that the unit force wave was determined, and the force wave determination processing is ended.

Figure 26:
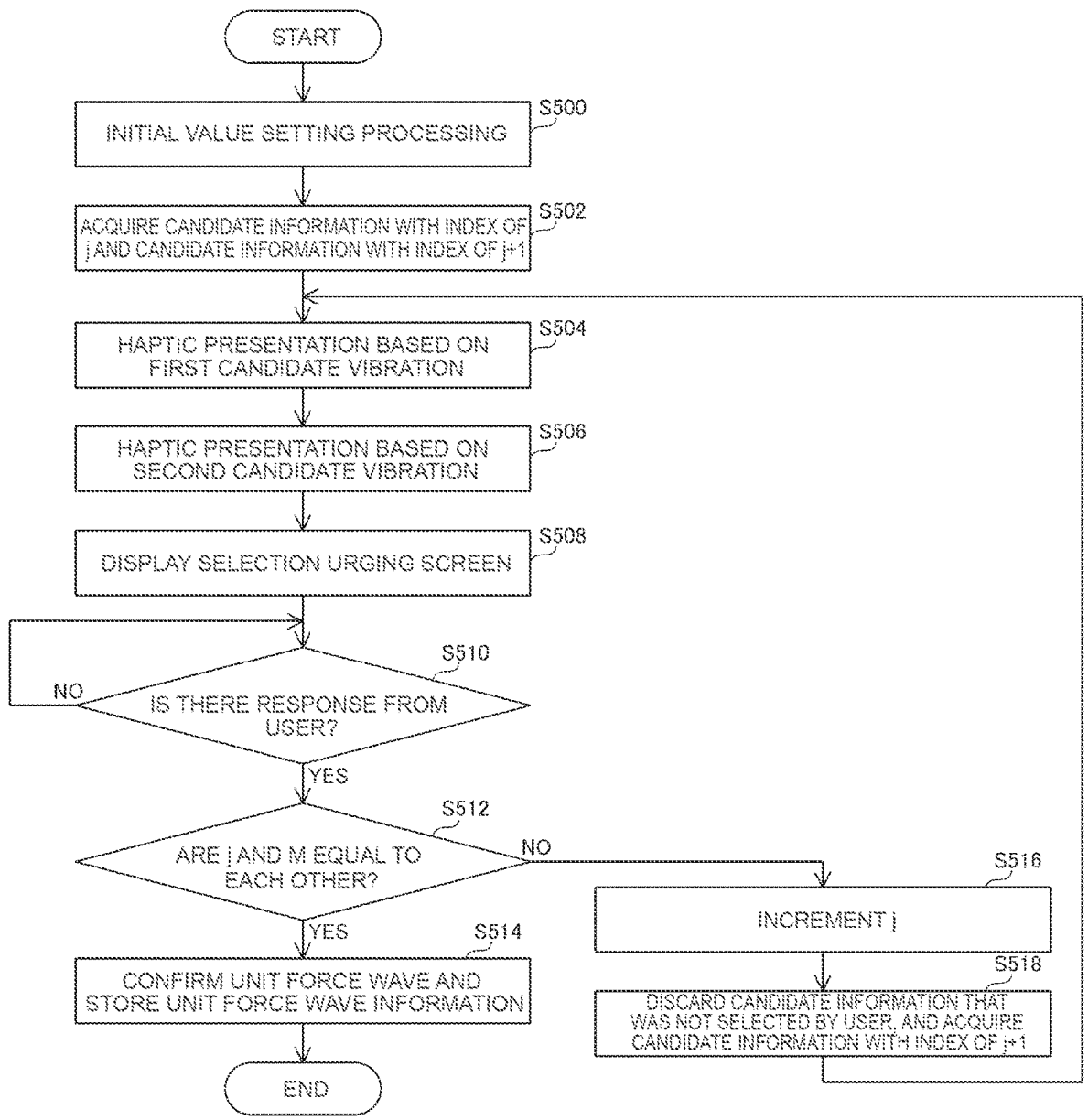
FIG. 26 is a flowchart defining an operation procedure when the force wave determination device according to the second exemplary embodiment performs force wave determination processing using indexes.

FIG. 26 is a flowchart defining an operation procedure when the force wave determination device according to the second exemplary embodiment performs force wave determination processing using indexes. The flowchart illustrated in FIG. 26 is different from the flowchart illustrated in FIG. 25 in that indexes are used to determine whether or not the selection of the unit force wave was sufficiently narrowed down.

As illustrated in FIG. 26, for example, such a situation that M (i.e., an integer of 2 or greater) pieces of candidate information are stored on the disk 14 and these pieces of candidate information are managed by 1 to M indexes is first assumed.

When receiving the force wave determination processing execution command from the command reception unit 51, the candidate information processing unit 52 in the force wave determination device 2 performs initial value setting processing for setting an integer j to 1 (step S500).

Next, the candidate information processing unit 52 acquires, from the disk 14, candidate information with an index of j and candidate information with an index of j+1 from among the M pieces of candidate information stored on the disk 14 (step S502).

Next, the candidate information processing unit 52 outputs, to the presentation processing unit 53, the candidate information with the index of j as first candidate information. When receiving the first candidate information from the candidate information processing unit 52, the presentation processing unit 53 causes the controller 21 to generate a first candidate vibration based on the first candidate information and the envelope waveform information. Thus, haptic presentation based on the first candidate vibration is performed (step S504).

Next, when the waiting time W passes after the first candidate information is output to the presentation processing unit 53, the candidate information processing unit 52 outputs, to the presentation processing unit 53, the candidate information with the index of j+1 as second candidate information. When receiving the second candidate information from the candidate information processing unit 52, the presentation processing unit 53 causes the controller 21 to generate a second candidate vibration based on the second candidate information and the envelope waveform information.

Thus, haptic presentation based on the second candidate vibration is performed (step S506).

Next, when the waiting time W passes after the first candidate information is output to the presentation processing unit 53, the candidate information processing unit 52 controls the GPU 16 to display, on the display monitor 20, that the user 6 is urged to select either one of the first candidate vibration that first occurred and the second candidate vibration that last occurred (step S508).

Next, the operation information reception unit 57 waits until operation information is received from the controller 21 (NO in step S510). Then, when receiving operation information from the controller 21 (YES in step S510), the operation information reception unit 57 outputs the received operation information to the candidate information processing unit 52.

Next, when receiving the operation information from the operation information reception unit 57, the candidate information processing unit 52 determines whether or not the integers j and M are equal to each other (step S512).

When determining that the integers j and M are not equal (NO in step S512), the candidate information processing unit 52 increments the integer j (step S516).

Next, the candidate information processing unit 52 discards candidate information that was not selected by the user 6, and acquires candidate information with the index of j+1 from the disk 14 (step S518).

Next, the candidate information processing unit 52 outputs, to the presentation processing unit 53, first candidate information as either one of the candidate information with the index of j+1 and the candidate information selected by the user 6. When receiving the first candidate information from the candidate information processing unit 52, the presentation processing unit 53 causes the controller 21 to generate a first candidate vibration based on the first candidate information and the envelope waveform information. Thus, haptic presentation based on the first candidate vibration is performed (step S504).

On the other hand, when determining that the integers j and M are equal (YES in step S512), the candidate information processing unit 52 determines the unit force wave to be used in the game program, and stores candidate information indicative of the unit force wave on the disk 14 as unit force wave information (step S514).

The candidate information processing unit 52 outputs, to the game program, determination information indicating that the unit force wave was determined, and the force wave determination processing is ended.

Note that, in the force wave determination device 2 of the present embodiment, such a configuration that the user 6 selects either one of the first candidate vibration that first occurred and the second candidate vibration that last occurred is described, but it should be appreciated that the present invention is not limited thereto. For example, the configuration may also be such that an AI (Artificial Intelligence) that learned the taste and preference of the user 6 selects either one of the first candidate vibration that first occurred and the second candidate vibration that last occurred. This can determine a unit force wave that suits the taste and preference of the user 6 in a short time without burdening the user 6.

Further, in the force wave determination device 2 of the present embodiment, such a configuration that the candidate information and the unit force wave information indicate the unit force wave is described, but it should be appreciated that the present invention is not limited thereto. The configuration may also be such that the candidate information and the unit force wave information indicate a force wave in which multiple of unit force waves concerned are continuous.

Further, in the force wave determination device 2 of the present embodiment, such a configuration that both the first candidate vibration that first occurred and the second candidate vibration that last occurred are presented to the user 6 is described, but it should be appreciated that the present invention is not limited thereto. The force wave determination device 2 may be configured to present three or more candidate vibrations to the user 6 so that the user 6 selects one candidate vibration from among these candidate vibrations.

Further, in the signal generation device 1 of the first embodiment and the force wave determination device 2 of the present embodiment, such a configuration that each force wave is a periodic wave is described, but it should be appreciated that the present invention is not limited thereto. The force wave may be a wave with no cycle. Specifically, for example, the configuration may also be such that part of the force wave is a periodic wave such as in a case where L unit force waves 73a each having the cycle Pu1 (see FIG. 19) (L is an integer of 2 or greater) are continuing after K unit force waves 73 each having the cycle Pu (see FIG. 19) (K is an integer of 2 or greater) are continued. In other words, the force wave may also be configured to include a wave having a cycle. Further, for example, the force wave may be so configured that the cycle Pu of the unit force wave 73 changes at random.

Figure 27:
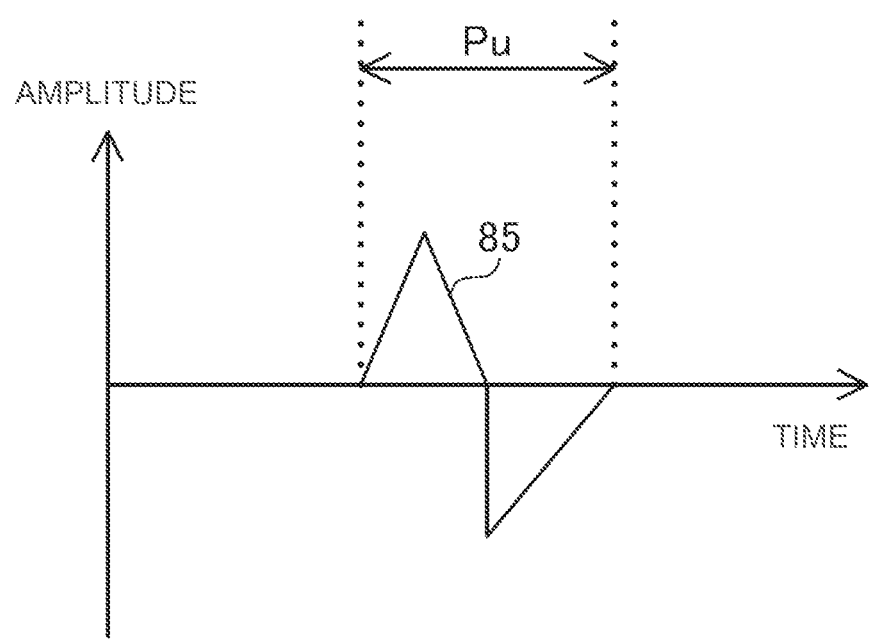
FIG. 27 is a graph illustrating a modification of a candidate unit force wave stored on the disk according to the second exemplary embodiment.

Further, in the force wave determination device 2 of the present embodiment, such a configuration that the waveform shape of each unit force wave for one cycle has point symmetry or rotational symmetry, such as the unit force wave 83 as a sawtooth wave, the unit force wave 73 as a square wave, and the unit force wave 84 (see FIG. 20) as a triangle wave, is described, the present invention is not limited thereto. FIG. 27 is a graph illustrating a modification of a candidate unit force wave stored on the disk according to the second exemplary embodiment. As illustrated in FIG. 27, like a unit force wave 85, the waveform shape of the candidate unit force wave for one cycle may also be configured not to have any symmetry such as point symmetry, rotational symmetry, or line symmetry, that is, the waveform shape for one cycle may be asymmetrical. Further, the unit force waves 73a, 73b, 73c, 73d, 83, 84, and 85 can be used in the signal generation device 1 of the first embodiment.

Further, in the signal generation device 1 of the first embodiment and the force wave determination device 2 of the present embodiment, such a configuration that the sign of the amplitude of an event-specific force amplitude envelope is either positive or negative like the event-specific force amplitude envelope 71P (see FIG. 8) and the event-specific force amplitude envelope 71M (see FIG. 9) is described, but it should be appreciated that the present invention is not limited thereto. The event-specific force amplitude envelope may also be configured to include a part in which the sign of the amplitude is positive and a part in which the sign of the amplitude is negative.

Figure 28:
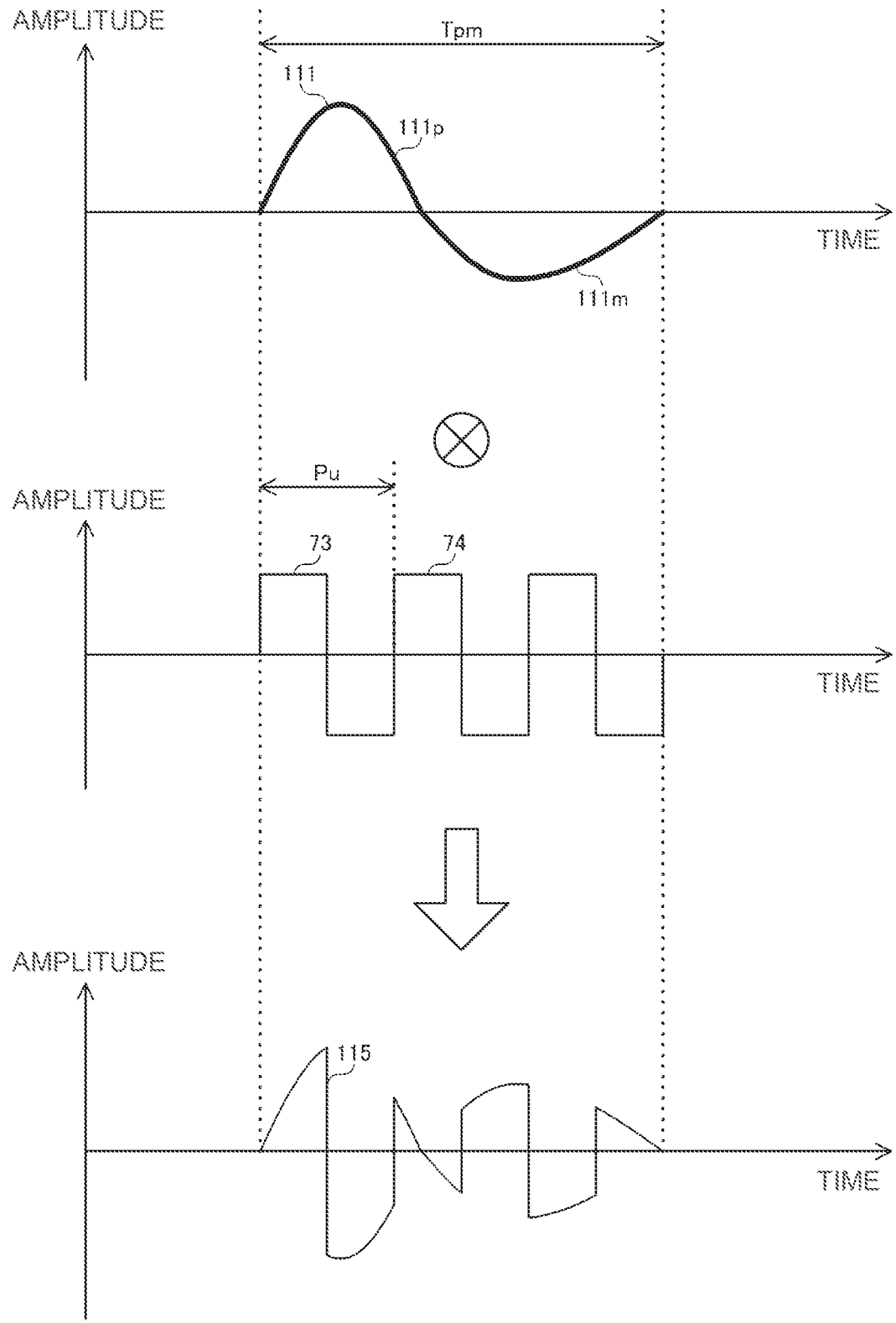
FIG. 28 is a graph illustrating a modification of an event-specific force amplitude envelope according to the first exemplary embodiment and the second exemplary embodiment.

FIG. 28 is a graph illustrating a modification of an event-specific force amplitude envelope according to the first embodiment and the second embodiment. As illustrated in FIG. 28, for example, an event-specific force amplitude envelope 111 has a part 111p in which the sign of the amplitude is positive and a part 111m in which the sign of the amplitude is negative during a waveform signal generation period Tpm. For example, when a force wave 74 is modulated by the event-specific force amplitude envelope 111, a waveform signal 115 is generated.

As mentioned above, the exemplary embodiments of the present invention are described. In particular, the signal generation device 1 is configured to generate a waveform signal to cause the controller 21 to generate a vibration according to an event. In the signal generation device 1, the envelope generation information acquisition unit 32 is configured to acquire first envelope information P1 indicative of the event-specific force amplitude envelope 71Pa of the waveform signal 75d corresponding to the event E1, and second envelope information P2 indicative of the event-specific force amplitude envelope 71Pb of the waveform signal 75e corresponding to the event E1. Based on the first envelope information P1 and the second envelope information P2, the current amplitude calculation unit 33 is configured to generate the composite envelope 72a obtained by synthesizing the event-specific force amplitude envelopes 71Pa and 71Pb. The modulation unit 35 is configured to modulate the force wave 74 by the composite envelope 72a to generate the waveform signal 75b.

Thus, such a configuration that the composite envelope 72a obtained by synthesizing the event-specific force amplitude envelope 71Pa having a time change smaller than the time change of the waveform signal 75d, and the event-specific force amplitude envelope 71Pb having a time change smaller than the time change of the waveform signal 75e is generated can suppress a change in the shape of the composite envelope 72a due to the difference between the start time of the waveform signal 75d and the start time of the waveform signal 75e. Thus, even when occurrence times of two events vary, since the change in the shape of the composite envelope 72a is suppressed, the change in the shape of the waveform signal 75b to cause the controller 21 to vibrate can be suppressed. Therefore, in the configuration to generate a waveform signal to cause the controller 21 to generate a vibration according to an event, the modes of vibration in the controller 21 when two events have occurred can be stabilized. Thus, the user 6 can receive an expected force sense, and the sense of presence can be improved by the favorable force sense.

Further, in the signal generation device 1, the envelope generation information acquisition unit 32 is configured to acquire first envelope information Q1 indicative of the event-specific force amplitude envelope 71Pc of the waveform signal 75f corresponding to the event E1, and second envelope information Q2 indicative of the event-specific force amplitude envelope 71Ma corresponding to the waveform signal 75g corresponding to the event E2. Based on the first envelope information Q1 and the second envelope information Q2, the current amplitude calculation unit 33 is configured to generate the composite envelope 72b obtained by synthesizing the event-specific force amplitude envelopes 71Pc and 71Ma. The modulation unit 35 is configured to modulate the force wave 74 by the composite envelope 72b to generate the waveform signal 75c.

Thus, such a configuration that the composite envelope 72b obtained by synthesizing the event-specific force amplitude envelope 71Pc having a time change smaller than the time change of the waveform signal 75f, and the event-specific force amplitude envelope 71Ma having a time change smaller than the time change of the waveform signal 75g is generated can suppress a change in the shape of the composite envelope 72b due to the difference between start time t5 of the waveform signal 75f and start time t6 of the waveform signal 75g. Thus, even when occurrence times of two events vary, since the change in the shape of the composite envelope 72b is suppressed, the change in the shape of the waveform signal 75c to cause the controller 21 to vibrate can be suppressed. Therefore, in the configuration to generate a waveform signal to cause the controller 21 to generate a vibration according to an event, the modes of vibration in the controller 21 when two events have occurred can be stabilized. Thus, the user 6 can receive an expected force sense, and the sense of presence can be improved by the favorable force sense.

Further, in the signal generation device 1, the sign of the event-specific force amplitude envelope 71Pa and the sign of the event-specific force amplitude envelope 71Pb are the same.

With such a configuration, since the amplitude of the composite envelope 72a can be made equal to or more than the amplitudes of the event-specific force amplitude envelopes 71Pa and 71Pb, the waveform signal 75b suitable for events that require the effect of strengthening two events with each other when the two events overlap, for example, like when being pulled twice in the same direction, can be generated. Thus, even when the occurrence times of the two events vary, a force sense of being pulled in the same direction in two stages can be stably given to the user 6.

Further, in the signal generation device 1, the sign of the event-specific force amplitude envelope 71Pc and the sign of the event-specific force amplitude envelope 71Ma are different.

With such a configuration, since the amplitude of the composite envelope 72b can be made equal to or less than the amplitudes of the event-specific force amplitude envelopes 71Pc and 71Ma, the waveform signal 75c suitable for events that require the effect of weakening two events with each other when the two events overlap, for example, like when being pulled from a certain direction and further pulled from an opposite direction, can be generated. Thus, even when the occurrence times of the two events vary, a weak force sense as a result of being pulled from opposite directions can be stably given to the user 6.

Further, in the signal generation device 1, the waveform signal 75d is started at time t1 based on the start time of the event indicated by the event information used to generate the first envelope information P1. The waveform signal 75e is started at time t2 based on the start time of the event indicated by the event information used to generate the second envelope information P2. The current amplitude calculation unit 33 generates the composite envelope 72a obtained by synthesizing the event-specific force amplitude envelope 71Pa started at time t1 and the event-specific force amplitude envelope 71Pb started at time t2.

With such a configuration, the start time t1 of the event-specific force amplitude envelope 71Pa can be made simultaneous with the start time of the corresponding event, or made later or earlier than the start time of the corresponding event. Similarly, the start time t2 of the event-specific force amplitude envelope 71Pb can be made simultaneous with the start time of the corresponding event, or made later or earlier than the start time of the corresponding event. Thus, in consideration of perceptual properties of a force sense corresponding to the content of the event, a comfortable force sense that suits the content can be given to the user 6.

Further, in the signal generation device 1, the waveform signal 75f is started at time t5 based on the start time of the event indicated by the event information used to generate the first envelope information Q1. The waveform signal 75g is started at time t6 based on the start time of the event indicated by the event information used to generate the second envelope information Q2. The current amplitude calculation unit 33 generates the composite envelope 72b obtained by synthesizing the event-specific force amplitude envelope 71Pc started at time t5 and the event-specific force amplitude envelope 71Ma started at time t6.

With such a configuration, the start time t5 of the event-specific force amplitude envelope 71Pc can be made simultaneous with the start time of the corresponding event, or made later or earlier than the start time of the corresponding event. Similarly, the start time t6 of the event-specific force amplitude envelope 71Ma can be made simultaneous with the start time of the corresponding event, or made later or earlier than the start time of the corresponding event. Thus, in consideration of perceptual properties of a force sense corresponding to the content of the event, a comfortable force sense that suits the content can be given to the user 6.

Further, in the signal generation device 1, the envelope generation information acquisition unit 32 acquires the weighting information w1 indicative of weighting of the event-specific force amplitude envelopes 71Pa and 71Pb. The current amplitude calculation unit 33 generates the composite envelope 72a obtained by synthesizing the event-specific force amplitude envelopes 71Pa and 71Pb based on the weighting information w1.

With such a configuration, for example, at least either one of the amplitude of the event-specific force amplitude envelope 71Pa and the amplitude of the event-specific force amplitude envelope 71Pb can be adjusted and synthesized to generate the composite envelope 72a. Thus, a force sense to be given to the user 6 can be adjusted according to the content of the event. Further, at least either one of the amplitude of the event-specific force amplitude envelope 71Pa and the amplitude of the event-specific force amplitude envelope 71Pb can be dynamically adjusted and synthesized to generate the composite envelope 72a. Thus, a force sense to be given to the user 6 can be adjusted according to the progress of the game, the degree of overlap between the event-specific force amplitude envelopes 71Pa and 71Pb, or the like.

Further, in the signal generation device 1, the envelope generation information acquisition unit 32 is configured to acquire the pieces of weighting information w1 and w2 indicative of weighting of the event-specific force amplitude envelopes 71Pc and 71Ma, respectively. Based on the pieces of weighting information w1 and w2, the current amplitude calculation unit 33 is configured to generate the composite envelope 72b obtained by synthesizing the event-specific force amplitude envelopes 71Pc and 71Ma.

With such a configuration, for example, at least either one of the amplitude of the event-specific force amplitude envelope 71Pc and the amplitude of the event-specific force amplitude envelope 71Ma can be adjusted and synthesized to generate the composite envelope 72b. Thus, a force sense to be given to the user 6 can be adjusted according to the content of the event. Further, at least either one of the amplitude of event-specific force amplitude envelope 71Pc and the amplitude of the event-specific force amplitude envelope 71Ma can be dynamically adjusted and synthesized to generate the composite envelope 72b. Thus, a force sense to be given to the user 6 can be adjusted according to the progress of the game, the degree of overlap between the event-specific force amplitude envelopes 71Pc and 71Ma, or the like.

Further, in the signal generation device 1, the force wave 74 is a wave vibrating during the waveform signal generation period Tpa of the event-specific force amplitude envelope 71Pa and the waveform signal generation period Tpb of the event-specific force amplitude envelope 71Pb, or during the waveform signal generation period Tpc of the event-specific force amplitude envelope 71Pc and the waveform signal generation period Tma of the event-specific force amplitude envelope 71Ma.

With such a configuration, the force wave 74 can be modulated properly by the composite envelopes 72a and 72b to generate favorable waveform signals 75b and 75c.

Further, in the signal generation device 1, the force wave 74 has the cycle Pu.

With such a configuration, the force wave 74 can be generated by simple processing to make unit force wave 73 with fewer amount of data continuous.

Further, in the force wave determination device 2, the candidate information processing unit 52 is configured to acquire first candidate information indicative of a first candidate wave as a candidate of the force wave 74 modulated by the event-specific force amplitude envelope 71P of a waveform signal to cause the controller 21 to generate a vibration, and second candidate information indicative of a second candidate force wave as the candidate but different from the first candidate force wave. Based on the first candidate information and the second candidate information, the modulation unit 35 is configured to modulate the first candidate force wave and the second candidate force wave respectively by the event-specific force amplitude envelope 71P to generate the waveform signals 75a and 75h. The output unit 37 is configured to cause (e.g., control) the controller 21 to generate a first candidate vibration based on the waveform signal 75a and a second candidate vibration based on the waveform signal 75h, respectively. The operation information reception unit 57 is configured to acquire a result of selecting either one of the first candidate vibration and the second candidate vibration. Then, the candidate information processing unit 52 is configured to determine a force wave based on the result.

Thus, such a configuration that the waveform signal 75a based on the first candidate force wave and the waveform signal 75h based on the second candidate force wave different from the first candidate force wave is generated can cause the controller 21 to generate the first candidate vibration based on the waveform signal 75a and the second candidate vibration based on the waveform signal 75h different from the first candidate vibration. Thus, since different force senses can be generated by the first candidate vibration and the second candidate vibration, it can be determined which of the first candidate vibration and the second candidate vibration suits the taste of the user 6 based on the result of selecting either one of the first candidate vibration and the second candidate vibration. Therefore, a force sense that suits the taste of the user 6 can be realized.

Further, in the force wave determination device 2, the force waves 74 and 74d have the cycle Pu.

With such a configuration, the unit force waves 73 and 73d can be generated by simple processing to make the unit force waves 73 and 73d with fewer amount of data continuous.

Further, in the force wave determination device 2, for example, the first candidate force wave is a force wave in which the unit force wave 73 is continuous, and the second candidate force wave is a force wave in which the unit force wave 73a is continuous. The waveform of the first candidate force wave and the waveform of the second candidate force wave have the same shape. Then, the fundamental frequency of the first candidate force wave and the fundamental frequency of the second candidate force wave are different.

Thus, such a configuration that the fundamental frequency of the first candidate force wave and the fundamental frequency of the second candidate force wave are made different can determine a fundamental frequency to give a force sense that suits the taste of the user 6.

Further, in the force wave determination device 2, for example, the first candidate force wave is a force wave in which the unit force wave 73 is continuous, and the second candidate force wave is a force wave in which the unit force wave 83 is continuous. The fundamental frequency of the first candidate force wave and the fundamental frequency of the second candidate force wave are the same. Then, the waveform of the first candidate force wave and the waveform of the second candidate force wave have different shapes.

Thus, such a configuration that the waveform of the first candidate force wave and the waveform of the second candidate force wave have different shapes can determine the shape of a force wave to give a force sense that suits the taste of the user 6.

Further, in the force wave determination device 2, for example, the first candidate force wave is a force wave in which the unit force wave 73 is continuous, and the second candidate force wave is a force wave in which the unit force wave 73d is continuous. The fundamental frequency of the first candidate force wave and the fundamental frequency of the second candidate force wave are the same. The waveform of the first candidate force wave and the waveform of the second candidate force wave have the same shape. Then, the smoothness of the waveform of the first candidate force wave and the smoothness of the waveform of the second candidate force wave are different.

Thus, such a configuration that the smoothness of the waveform of the first candidate force wave and the smoothness of the waveform of the second candidate force wave are different can adjust the proportion of high frequency components of a force wave optimized, for example, in terms of the parameters of the fundamental frequency and the waveform, to further optimize the force wave in order to determine a force wave to give a force sense that suits the taste of the user 6.

Further, in the force wave determination device 2, the operation information reception unit 57 is configured to acquire the selection results of the first candidate vibration and the second candidate vibration by the user 6.

With such a configuration, since the taste of the user 6 can be directly reflected in the selection of the first candidate vibration and the second candidate vibration, a force wave to give a force sense unsuitable to the taste of the user 6 can be prevented from being determined.

Further, in the force wave determination device 2, the force waves 74 and 74d are waves vibrating during the waveform signal generation period Tp of the event-specific force amplitude envelope 71P.

With such a configuration, the force waves 74 and 74d can be modulated properly by the event-specific force amplitude envelope 71P to generate the favorable waveform signals 75a and 75h.

In general, it is noted that each of the embodiments described above is to make it easier to understand the present invention, and it is not intended to limit the interpretation of the present invention. It should be appreciated that the present invention can be changed/improved without departing from the scope thereof, and equivalents thereof are included in the present invention. Namely, any design change added to each embodiment by a person skilled in the art is included in the scope of the present invention as long as it has the features of the present invention. For example, each element, the arrangement, material, condition, shape, and size of the element, and the like included in each embodiment are not limited to those illustrated, and changes can be made appropriately. Further, each embodiment is just an illustrative example, and it is needless to say that configurations illustrated in different embodiments can be partially replaced or combined, and these are included in the scope of the present invention as long as they have the features of the present invention.

REFERENCE SIGNS LIST

1 . . . signal generation device
2 . . . force wave determination device
3 . . . game system
11 . . . computer
19 . . . speaker
20 . . . display monitor
21 . . . controller
31 . . . event reception unit
32 . . . envelope generation information acquisition unit
33 . . . current amplitude calculation unit
34 . . . counter
35 . . . modulation unit
36 . . . unit force wave information acquiring unit
37 . . . output unit
51 . . . command reception unit
52 . . . candidate information processing unit
53 . . . presentation processing unit
55 . . . envelope waveform information acquisition unit
57 . . . operation information reception unit
63 . . . current amplitude calculation unit
71 . . . event-specific force amplitude envelope
72 . . . composite envelope
73 . . . unit force wave
74 . . . force wave
75 . . . waveform signal
83, 84, 85 . . . unit force wave
101 . . . correspondence information
111 . . . event-specific force amplitude envelope
115 . . . waveform signal

What is claimed is:

1. A signal generation device for causing a target object to vibrate according to a phenomenon, comprising:
an envelope information acquisition unit configured to acquire first envelope information indicative of a first envelope of a first waveform signal corresponding to a first phenomenon, and second envelope information indicative of a second envelope of a second waveform signal corresponding to a second phenomenon;

a synthesis unit configured to generate a composite envelope obtained by synthesizing the respective envelopes based on the first envelope information and the second envelope information; and a modulation unit configured to modulate a force wave based on the composite envelope to generate a waveform signal that causes the target object to vibrate.

2. The signal generation device according to claim 1, wherein the first envelope has a sign that is the same as a sign of the second envelope.

3. The signal generation device according to claim 1, wherein the first envelope has a sign that is different than a sign of the second envelope.

4. The signal generation device according to claim 1, wherein:
the first waveform signal is started at a first timing based on a start timing of the first phenomenon,
the second waveform signal is started at a second timing based on a start timing of the second phenomenon, and
the synthesis unit is configured to generate the composite envelope obtained by synthesizing the first envelope started at the first timing and the second envelope started at the second timing.

5. The signal generation device according to claim 1, further comprising:
a weighting information acquisition unit configured to acquire weighting information indicative of weighting the first envelope and the second envelope, respectively,
wherein the synthesis unit is further configured to generate the composite envelope obtained by synthesizing the first envelope and the second envelope based on the acquired weighting information.

6. The signal generation device according to claim 1, wherein the force wave is a wave vibrating during a generation period of the first envelope and a generation period of the second envelope.

7. The signal generation device according to claim 1, wherein the force wave has a cycle.

8. The signal generation device according to claim 1, further comprising a memory and a processor configured to execute software on the memory that provides:
the envelope information acquisition unit to acquire the first envelope information and the second envelope information,
the synthesis unit to generate the composite envelope, and
the modulation unit to modulate the force wave.

9. The signal generation device according to claim 1, wherein the waveform signal is configured as an electronic signal that is converted by a haptic element in the target object to cause the target object to vibrate as a mechanical vibration.

10. A method for generating a waveform signal for causing a target object to vibrate according to a phenomenon, the method comprising:
acquiring first envelope information indicative of a first envelope of a first waveform signal corresponding to a first phenomenon;
acquiring second envelope information indicative of a second envelope of a second waveform signal corresponding to a second phenomenon;
generating a composite envelope obtained by synthesizing the respective envelopes based on the first envelope information and the second envelope information; and
modulating a force wave based on the composite envelope to generate the waveform signal that causes the target object to vibrate.

11. The method according to claim 10, wherein the first envelope has a sign that is the same as a sign of the second envelope.

12. The method according to claim 10, wherein the first envelope has a sign that is different than a sign of the second envelope.

13. The method according to claim 10, further comprising:
starting the first waveform signal at a first timing based on a start timing of the first phenomenon;
starting the second waveform signal at a second timing based on a start timing of the second phenomenon; and
generating the composite envelope obtained by synthesizing the first envelope started at the first timing and the second envelope started at the second timing.

14. The method according to claim 10, further comprising:
acquiring weighting information indicative of weighting the first envelope and the second envelope, respectively; and
generating the composite envelope obtained by synthesizing the first envelope and the second envelope based on the acquired weighting information.

15. The method according to claim 10, wherein the force wave is a wave vibrating during a generation period of the first envelope and a generation period of the second envelope.

16. The method according to claim 10, further comprising providing the waveform signal as an electronic signal that is converted by a haptic element in the target object to cause the target object to vibrate as a mechanical vibration.

17. A signal generation program that configures a signal generation device to generate a waveform signal for causing a target object to vibrate according to a phenomenon, the signal generation program that, when executed by a processor of a computer, configures the signal generation device to:
acquire first envelope information indicative of a first envelope of a first waveform signal corresponding to a first phenomenon;
acquire second envelope information indicative of a second envelope of a second waveform signal corresponding to a second phenomenon;
generate a composite envelope obtained by synthesizing the respective envelopes based on the first envelope information and the second envelope information;
modulate a force wave by the composite envelope to generate the waveform signal that causes the target object to vibrate.

18. The signal generation program according to claim 17, wherein, when executed by the processor, further configures the signal generation device to:
start the first waveform signal at a first timing based on a start timing of the first phenomenon;
start the second waveform signal at a second timing based on a start timing of the second phenomenon; and
generate the composite envelope obtained by synthesizing the first envelope started at the first timing and the second envelope started at the second timing.

19. The signal generation program according to claim 17, wherein, when executed by the processor, further configures the signal generation device to:
acquire weighting information indicative of weighting the first envelope and the second envelope, respectively; and
generate the composite envelope obtained by synthesizing the first envelope and the second envelope based on the acquired weighting information.

20. The signal generation program according to claim 17, wherein, when executed by the processor, further configures the signal generation device to provide the waveform signal as an electronic signal that is converted by a haptic element in the target object to cause the target object to vibrate as a mechanical vibration.

\* \* \* \* \*